United States Patent
Tanabe et al.

(10) Patent No.: US 6,784,038 B2
(45) Date of Patent: *Aug. 31, 2004

(54) PROCESS FOR PRODUCING SEMICONDUCTOR INTEGRATED CIRCUIT DEVICE AND SEMICONDUCTOR INTEGRATED CIRCUIT DEVICE

(75) Inventors: Yoshikazu Tanabe, Iruma (JP); Naoki Yamamoto, Kawaguchi (JP); Shinichiro Mitani, Tokorozawa (JP); Yuko Hanaoka, Kodaira (JP)

(73) Assignee: Renesas Technology Corp., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/929,091

(22) Filed: Aug. 15, 2001

(65) Prior Publication Data

US 2002/0004263 A1 Jan. 10, 2002

Related U.S. Application Data

(62) Division of application No. 09/314,956, filed on May 20, 1999, now Pat. No. 6,323,115.

(30) Foreign Application Priority Data

May 20, 1998 (JP) .......................................... 10-138939

(51) Int. Cl.[7] .......................................... H01L 21/8238
(52) U.S. Cl. ........................ 438/199; 438/197; 438/653; 438/656
(58) Field of Search .......................... 438/199; 436/197, 436/229, 283, 585, 587, 592, 653, 656

(56) References Cited

U.S. PATENT DOCUMENTS

| 5,719,410 A | 2/1998 | Suehiro et al. |
| 5,840,368 A | 11/1998 | Ohmi |
| 5,907,188 A | 5/1999 | Nakajima et al. |

(List continued on next page.)

FOREIGN PATENT DOCUMENTS

| JP | 60-89943 | 5/1985 |
| JP | 3-119763 | 5/1991 |
| JP | 5-152282 | 6/1993 |
| JP | 7-94716 | 4/1995 |
| JP | 7-094716 | 4/1995 |
| JP | 9-312270 | 12/1997 |

OTHER PUBLICATIONS

English Translation of the text portion of the Chinese Office Action dated Jan. 30, 2003 in a corresponding Chinese application.
Chinese Office Action dated Jan. 30, 2003
U.S. patent application Publication No.: US 2001/0051406 A1, Pub. Date: Dec. 13, 2001, Weimer, et al.
European Search Report transmitted Oct. 15, 2002, for EP 99 30 3683.

*Primary Examiner*—Jack Chen
(74) *Attorney, Agent, or Firm*—Antonelli, Terry, Stout & Kraus, LLP

(57) ABSTRACT

In order to provide a light oxidation process technique for use in a CMOS LSI employing a polymetal gate structure and a dual gate structure, so that both oxidation of a refractory metal film constituting a part of a gate electrode and diffusion of boron contained in a p-type polycrystalline silicon film constituting a part of the gate electrode can be prevented, a mixed gas containing a hydrogen gas and steam synthesized from an oxygen gas and a hydrogen gas is supplied to a major surface of a semiconductor wafer A1, and a heat treatment for improving a profile of a gate insulating film that has been cut by etching under an edge part of the gate electrode is conducted under a low thermal load condition in that the refractor metal film is substantially not oxidized, and boron contained in a p-type polycrystalline silicon film constituting a part of the gate electrode is not diffused to the semiconductor substrate through the gate oxide film.

2 Claims, 19 Drawing Sheets

U.S. PATENT DOCUMENTS

| | | |
|---|---|---|
| 6,162,741 A | 12/2000 | Akasaka et al. |
| 6,197,702 B1 * | 3/2001 | Tanabe et al. .............. 438/773 |
| 6,214,683 B1 | 4/2001 | Xiang et al. |
| 6,239,044 B1 | 5/2001 | Kashiwagi et al. |
| 6,323,115 B1 * | 11/2001 | Tanabe et al. .............. 438/592 |
| 6,362,086 B2 | 3/2002 | Weimer et al. |
| 2001/0042344 A1 | 11/2001 | Ohmi et al. |

* cited by examiner (a) $W + 3H_2O \rightleftharpoons WO_3 + 3H_2$
(b) $Mo + 2H_2O \rightleftharpoons MoO_2 + 2H_2$
(c) $2Ta + 5H_2O \rightleftharpoons Ta_2O_5 + 5H_2$
(d) $Si + 2H_2O \rightleftharpoons SiO_2 + 2H_2$
(e) $Ti + 2H_2O \rightleftharpoons TiO_2 + 2H_2$

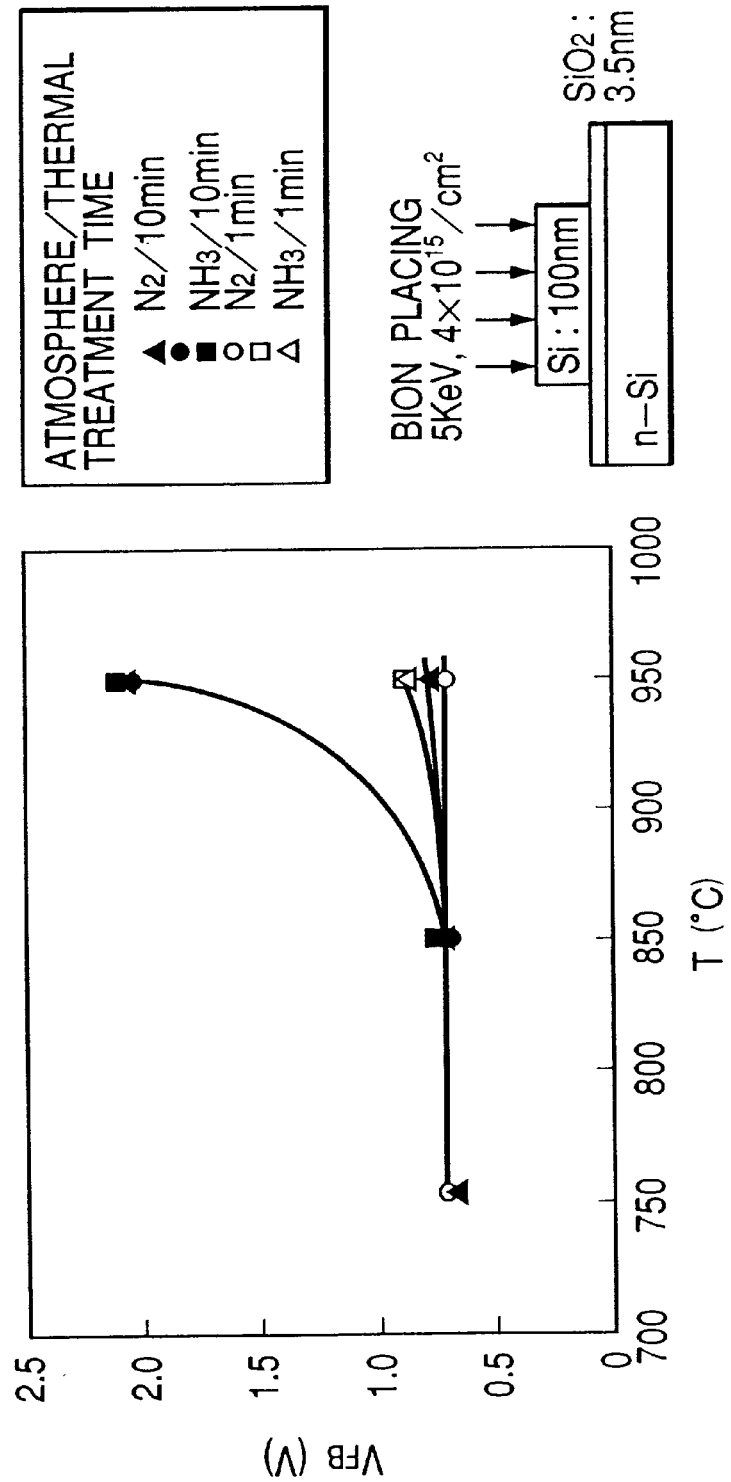

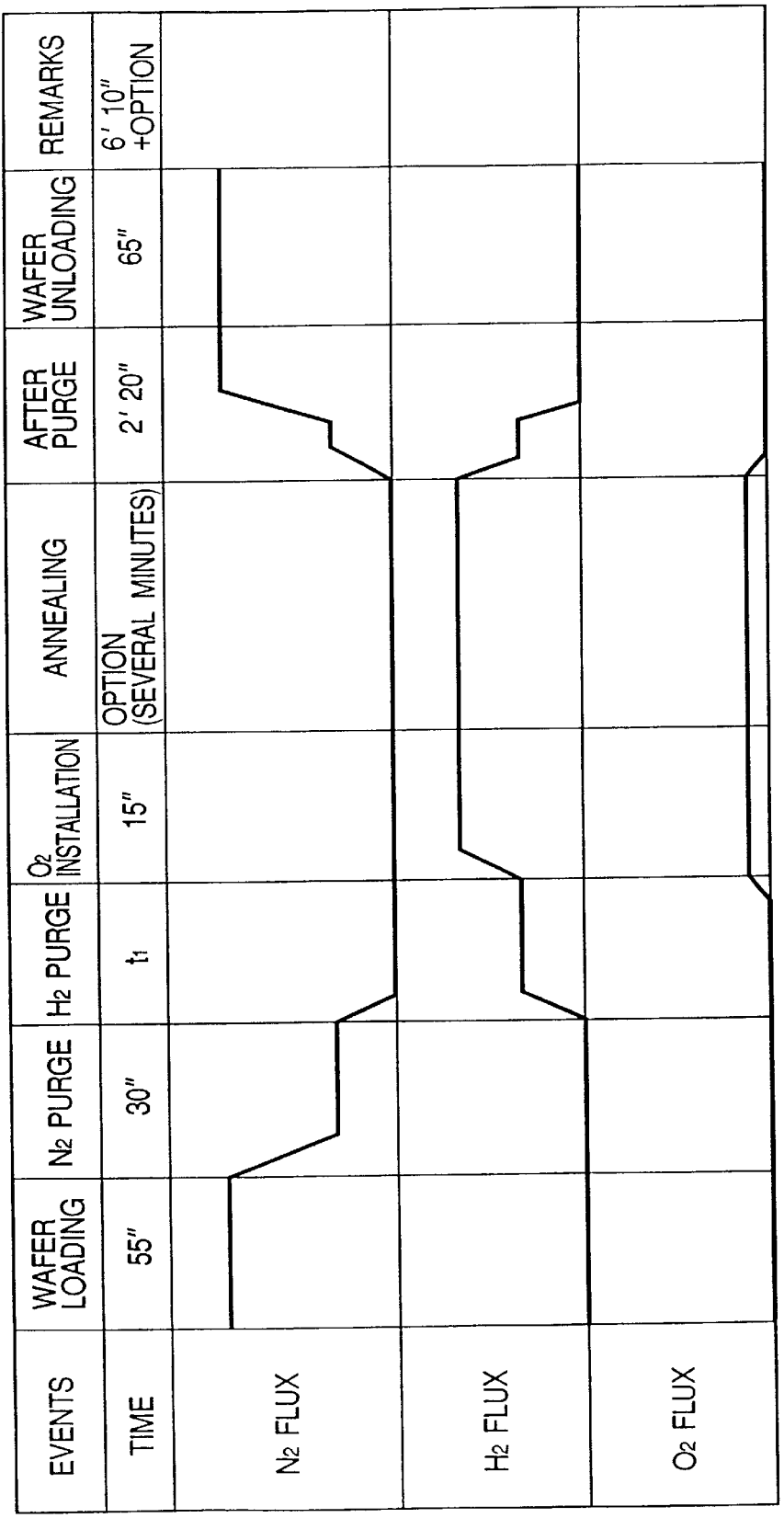

PROCESS FOR PRODUCING SEMICONDUCTOR INTEGRATED CIRCUIT DEVICE AND SEMICONDUCTOR INTEGRATED CIRCUIT DEVICE

This application is a Divisional application of Ser. No. 09/314,956, filed May 20, 1999 U.S. Pat. No. 6,323,115.

BACKGROUND OF THE INVENTION

The present invention relates to a process for producing a semiconductor integrated circuit device, and, more particularly, the invention relates to a technique that is effective for application to production of a semiconductor integrated circuit device having an MOSFET (metal oxide semiconductor field effect transistor) of a polymetal structure, in which a gate electrode is constituted with a laminated film of polycrystalline silicon containing boron (B) and a refractory metal.

Japanese Patent Laid-Open No. 132136/1-984 (hereinafter referred to as "Kobayashi 1") discloses a technique in which after forming a gate electrode of a polymetal structure containing a W film or an Mo film on an Si (silicon) substrate, light oxidation is carried out in a mixed atmosphere of steam and hydrogen to selectively oxidize only Si without oxidizing the W (Mo) film. This utilizes characteristics in which the steam/hydrogen partial pressure ratio, at which the redox reaction is at equilibrium, is different between W (Mo) and Si, and the selective oxidation of Si is realized in such a manner that the partial pressure ratio is set in a range in which, when W (Mo) is oxidized, it is immediately reduced with co-existing hydrogen, but Si remains as being oxidized. The mixed atmosphere of steam and hydrogen is formed by a bubbling method, in which a hydrogen gas is supplied into pure water contained in a container, and the steam/hydrogen partial pressure ratio is controlled by changing the temperature of the pure water.

Furthermore, other principal publications relating to selective oxidation by a group of the inventors of the above-described subject matter include Japanese Patent Laid-Open No. 89943/1985 (hereinafter referred to as "Kobayashi 2") and Japanese Patent-Laid-Open No. 150236/1986 (hereinafter referred to as "Iwata").

Japanese Patent Laid-open No. 94716/1995 (hereinafter referred to as "Muraoka") discloses a technique in which, after forming a gate electrode of a polymetal structure containing a metal nitride layer, such as TiN, and a metal layer, such as W, on an Si substrate via a gate oxide film, light oxidation is carried out in an atmosphere of a reducing gas (hydrogen) and an oxidative gas (steam) diluted with nitrogen. According to this technique, it is found that only Si can be selectively oxidized without oxidizing the metal layer, and oxidation of the metal nitride layer can also be prevented because the denitrification reaction from the metal nitride layer is prevented by diluting the steam/hydrogen mixed gas with nitrogen.

In Series of Theses of 45th Symposium of Semiconductor Integrated Circuit Techniques, held on Dec. 1 and 2 of 1992, pp. 128 to 133, (hereinafter referred to as Nakamura) there is disclosed a technique for forming an oxide film in a strong reducing atmosphere containing steam synthesized by a stainless catalyst.

SUMMARY OF THE INVENTION

In a CMOS LSI, the circuit of which is constituted by a fine MOSFET having a gate length of 0.18 $\mu$m or less, a gate working process using a low-resistance conductive material including a metal layer is employed to ensure high speed operation by reducing the gate delay during operation with a low voltage.

What is most likely to be the low resistance gate electrode material of this type is a polymetal obtained by laminating a refractory metal film on a polycrystalline silicon, film. Because the polymetal has a low sheet resistance of about 2 $\Omega$ per square, it can be used not only as the gate electrode material), but also as an interconnecting material. As the refractory metal, W (tungsten), Mo (molybdenum) and Ti (titanium) are used, which exhibit good low resistance characteristics even in a low temperature process of 800° C. or less and have a high electromigration resistance. When these refractory metal films are laminated directly on the polycrystalline silicon film, the adhesion strength between them may be decreased, and a silicide layer having a high resistance is formed at the interface between them during a high temperature heat treatment process. Therefore, the actual polymetal gate is constituted by a three-layer structure, in which a barrier layer comprising a metal nitride film, such as TiN (titanium nitride) and WN (tungsten nitride), is inserted between the polycrystalline silicon film and the refractory metal film.

The summary of the conventional gate working process is as follows. A semiconductor substrate is tubjected-to thermal oxidation to form a gate oxide film on the surface thereof. In general, the formation of the thermal oxide film is carried out in a dry oxygen atmosphere, but in the case of forming the gate oxide film, a wet oxidation method is employed because the defect density of the film can be decreased. In the wet oxidation method, a pyrogenic method is employed, in which hydrogenis burned in an oxygen atmosphere to form water, and the water thus formed is supplied along with oxygen to the surface of a semiconductor wafer.

However, in the pyrogenic method, because hydrogen discharged from a nozzle attached to a tip end of a hydrogen gas conduit made of quartz is ignited and burned, there is a possibility that particles are formed due to melting of the nozzle in response to heat, which can become a cause of contamination of the semiconductor wafer. Thus, a method of forming water by a catalyst method without burning has been proposed (Japanese Patent Laid-Open No. 152282/1993).

After a gate electrode material is accumulated on the gate oxide film formed by the wet oxidation method, the gate electrode material is patterned by dry etching using a photoresist as a mask. Thereafter, the photoresist is removed by ashing, and the dry etching residue and the ashing residue remaining on the surface of the substrate are removed by using an etching solution such as hydrofluoric acid.

When the wet etching described above is conducted, the gate oxide film in a region other than the lower part of the gate electrode is removed, and, at the same time, the gate oxide film at the edge of the side wall of the gate electrode is also isotropically etched to cause an undercut. Therefore, a problem of lowering the resisting voltage of the gate electrode occurs as it stands. Thus, in order to improve the profile at the edge of the side wall of a gate electrode which has been subjected to undercut, a process is conducted in which the substrate is again subjected to thermal oxidation to form an oxide film on the surface (hereinafter referred to as a light oxidation process).

However, because the refractory metal, such as W and Mo, described above is extremely liable to be oxidized in a high temperature oxygen atmosphere, when the light oxidation process is applied to a gate electrode having a polymetal structure, the refractory metal is oxidized to increase the resistance, and a part thereof is peeled from the substrate. Therefore, in the gate working process using a polymetal, means for preventing oxidation of the refractory metal during the light oxidation process is necessary.

In the process of forming the gate electrode having a polymetal structure, the light oxidation in a steam/hydrogen mixed gas having the prescribed partial pressure ratio is effective means for improving the resisting voltage of the gate oxide film and for preventing oxidation of the metal film.

However, in the conventional bubbling method, which has been proposed as a method for forming the steam/hydrogen mixed gas, because the steam/hydrogen mixed gas is formed by supplying a hydrogen gas to pure water set aside in a container, there is a possibility that foreign matter contained in the pure water will be transferred to an oxidation furnace along with the steam/hydrogen mixed gas to contaminate a semiconductor wafer.

Furthermore, in the bubbling method, because the steam/hydrogen partial pressure ratio is controlled by changing the temperature of the pure water, there are problems in that (1) the partial pressure is liable to fluctuate, and it is difficult to realize the optimum partial pressure ratio with high precision, and (2) the controllable range of the steam concentration is as narrow as from several percent to several tens of percent, and it is difficult to realize a steam concentration in a ppm order.

The redox reaction of Si and a metal using a steam/hydrogen mixed gas is liable to proceed when the steam concentration is higher, as will be described later. Therefore, when Si is oxidized under a relatively high steam concentration, such as the steam/hydrogen mixed gas formed by the bubbling method, an oxide film is grown in an extremely short period of time due to the high oxidation rate. However, in a fine MOSFET having a gate length of 0.18 $\mu$m or less, it required that the gate oxide film is formed to be extremely thin, as such 3.5 nm or less, to maintain the electric characteristics of the device. Therefore, it is difficult to uniformly form such an extremely thin gate oxidized film with good controllability by using the steam/hydrogen mixed gas formed by the bubbling method. Additionally, when oxidation is conducted at a low temperature to decrease the growing rate of the oxide film, an oxide film having good quality cannot be obtained.

Furthermore, in a CMOS LSI, the circuit of which is constituted by a fine MOSFET having a gate length of 0.18 $\mu$m or less, it is considered that the employment of a so-called dual gate structure is advantageous, in which, in order to suppress the fluctuation of the threshold voltage ($V_{th}$) due to operation at a low voltage as much as possible, the conductivity type of the polycrystalline silicon film constituting the gate electrode of the n-channel MISFET is set at the n-type, and the conductivity type of the polycrystalline silicon film constituting the gate electrode of the p-channel MISFET is set at the p-type. Therefore, in the case where the gate electrode is constituted by the polymetal described above, the gate electrode of the n-channel MISFET has a structure in which a refractory metal film is laminated on an n-type polycrystalline silicon film doped with an n-type impurity, such as phosphorous (P), and the gate electrode of the p-channel MISFET has a structure in which a refractory metal film is laminated on a p-type polycrystalline silicon film doped with a p-type impurity, such as boron (B).

However, because the diffusion coefficient of B (boron) as the p-type impurity is large, when the light oxidation process described above is applied to a CMOS device having the dual gate structure, there arises a problem in that B (boron) contained in the p-type polycrystalline silicon film constituting a part of the gate electrode of the p-channel MISFET diffuses into the substrate side through the extremely thin gate, oxide film having a film thickness of 3.5 nm or less, thereby to change the threshold voltage ($V_{th}$) of the p-channel MISFET.

Therefore, in a CMOS LSI employing a polymetal gate structure and a dual gate structure, it is important to develop a technique in which both the oxidation of the refractory metal and the diffusion of B (boron) into the substrate are suppressed during the light oxidation process after the gate working.

An object of the invention is to provide a light oxidation process technique in which, in a CMOS LSI employing a polymetal gate structure and a dual gate structure, both the oxidation of the refractory metal film constituting a part of the gate electrode and diffusion of boron contained in the p-type polycrystalline silicon film constituting another part of the gate electrode can be suppressed.

Another object of the invention is to provide a selective oxidation method which is applied to a semiconductor integrated circuit device having two parts, including a silicon part of a single crystal silicon or polysilicon and a part mainly comprising a refractory metal (fire resistant metal).

A further object of the invention is to provide a light oxidation process technique in which, in a semiconductor integrated circuit device having a gate containing a polysilicon layer doped with boron, both the oxidation of the refractory metal film and the diffusion of boron from the p-type polycrystalline silicon film constituting another part of the gate electrode through the gate oxide film can be suppressed.

A still further object of the invention is to provide a selective oxidation process technique in which, in a semiconductor integrated circuit device having a gate containing a polysilicon layer doped with boron, both the oxidation of the refractory metal film and the diffusion of boron from the p-type polycrystalline silicon film constituting another part of the gate electrode through the gate oxide film can be suppressed.

The above-described and other objects and novel characteristics of the invention will be apparent from the description of the present specification and attached drawings.

Among various embodiments of the invention, representative ones will be described below.

The process for producing a semiconductor integrated circuit device according to the invention comprises a step, in which a conductive film is formed comprising a gate oxide film formed on a major surface of a semiconductor substrate laminated with a polycrystalline silicon film containing boron and a refractory metal film directly or through a barrier layer, and a gate electrode of an MOSFET is formed by patterning the conductive film; and a heat treatment step, in which a mixed gas containing a hydrogen gas and steam synthesized from an oxygen gas and the hydrogen gas with a catalyst is supplied to the major surface or the vicinity of the semiconductor substrate heated to a prescribed temperature, and a profile of the gate insulating film under an edge part of the gate electrode etched on patterning in the preceding step is improved by selectively oxidizing the major surface of the semiconductor substrate, in which the heat treatment is conducted under a low thermal load condition in which the refractory metal film is substantially not oxidized, and boron contained in the polycrystalline silicon film constituting a part of the gate electrode is not diffused to the semiconductor substrate through the gate oxide film.

The substance of aspects the invention, other than those described above, will be itemized below.

1. A process for producing a semiconductor integrated circuit device comprising the steps of:

(a) forming a polycrystalline silicon film doped with boron over a gate insulating film containing a silicon oxide film formed over a silicon surface of a major surface of a semiconductor wafer (in the invention, an embodiment, in which after adhering a non-doped polycrystalline silicon film, boron is doped by ion implantation, is included. That is, the order of the doping of boron is not limited. An embodiment, in which adhering of the polycrystalline silicon film and doping of boron are simultaneously conducted, is also included, and hereinafter the same);

(b) forming a refractory metal film mainly comprising tungsten over the polycrystalline silicon film directly or via a barrier layer;

(c) forming a gate electrode by patterning the polycrystalline silicon film and the refractory metal film; and (d) after the step (c), subjecting the silicon surface and the polycrystalline silicon film positioned in a part corresponding to an edge part of the gate electrode to a thermal oxidation treatment in a mixed gas atmosphere containing a hydrogen gas and steam.

2. A process for producing a semiconductor integrated circuit device as in the item 1, wherein the barrier layer contains a tungsten nitride film.

3. A process for producing a semiconductor integrated circuit device as in the item 2, wherein the thermal oxidation treatment in the step (d) is conducted in a condition in that the refractory metal film and the barrier layer are substantially not oxidized.

4. A process for producing a semiconductor integrated circuit device as in the item 1, wherein the gate insulating film contains a silicon oxinitride film.

5. A process for producing a semiconductor integrated circuit device comprising the steps of:

(a) forming a polycrystalline silicon film doped with boron over a gate insulating film containing a silicon oxide film formed over a silicon surface of a major surface of a semiconductor wafer;

(b) forming a refractory metal film over the polycrystalline silicon film directly or via a barrier layer;

(c) forming a gate electrode by patterning the polycrystalline silicon film and the refractory metal film; and.

(d) after the step (c), subjecting the silicon surface and the polycrystalline silicon film positioned in a part corresponding to an edge part of the gate electrode to a thermal oxidation treatment in a mixed gas atmosphere containing a hydrogen gas and steam.

6. A process for producing a semiconductor integrated circuit device as in the item 5, wherein the barrier layer is inserted between the polycrystalline silicon film and the refractory metal film.

7. A process for producing a semiconductor integrated circuit device as in the item 6, wherein the thermal oxidation treatment in the step (d) is conducted in a condition in that the refractory metal film and the barrier layer are substantially not oxidized.

8. A process for producing a semiconductor integrated circuit device comprising the steps of:

(a) forming a first conductive film mainly comprising a polycrystalline silicon film doped with boron over a silicon surface of a major surface of a semiconductor wafer;

(b) forming a refractory metal film over the first conductive film directly or via a barrier layer;

(c) forming a gate electrode by patterning the first conductive film and the refractory metal film; and (d) after the step (c), subjecting the silicon surface and the polycrystalline silicon film positioned in a part corresponding to an edge part of the gate electrode to a thermal oxidation treatment in a mixed gas atmosphere containing a hydrogen gas and steam synthesized from an oxygen gas and a hydrogen gas.

9. A process for producing a semiconductor integrated circuit device as in the item 8, wherein the thermal oxidation treatment in the step (d) is conducted in a condition in that the refractory metal film is substantially not oxidized.

10. A process for producing a semiconductor integrated circuit device having a dual gate CMOS comprising the steps of:

(a) forming a polycrystalline silicon film doped with boron over a gate insulating film containing a silicon oxide film formed over a silicon surface of a major surface of a semiconductor wafer;

(b) forming a refractory metal film mainly comprising tungsten over the polycrystalline silicon film via a barrier layer containing tungsten nitride;

(c) forming a gate electrode by patterning the polycrystalline silicon film, the barrier layer and the refractory metal film; and (d) after the step (c), subjecting the silicon surface and the polycrystalline silicon film positioned in a part corresponding to an edge part of the gate electrode to a thermal oxidation treatment in a mixed gas atmosphere containing a hydrogen gas and steam.

11. A process for producing a semiconductor integrated circuit device having a dual gate CMOS comprising the steps of:

(a) forming a polycrystalline silicon film doped with boron over a gate insulating film containing a silicon oxide film formed over a silicon surface of a major surface of a semiconductor wafer;

(b) forming a refractory metal film mainly comprising tungsten over the polycrystalline silicon film via a barrier layer containing tungsten nitride;

(c) forming a gate electrode by patterning the polycrystalline silicon film, the barrier layer and the refractory metal film; and (d) after the step (c), subjecting the silicon surface and the polycrystalline silicon film to a thermal oxidation treatment in a mixed gas atmosphere having an oxidative property and a reducing property to silicon and polycrystalline silicon so as substantially not to oxidize the refractory metal film.

12. A process for producing a semiconductor integrated circuit device having a dual gate CMOS comprising the steps of:

(a) forming a polycrystalline silicon film doped with boron over a gate insulating film containing a silicon oxide film formed over a silicon surface of a major surface of a semiconductor wafer;

(b) forming a refractory metal film mainly comprising tungsten over the polycrystalline silicon film directly or via a barrier layer;

(c) forming a gate electrode by patterning the polycrystalline silicon film and the refractory metal film; and (d) after the step (c), subjecting the silicon surface and the polycrystalline silicon film to a thermal oxidation treatment in a mixed gas atmosphere having an oxidative property and a reducing property to silicon and polycrystalline silicon so as substantially not to oxidize the refractory metal film.

13. A process for producing a semiconductor integrated circuit device having a dual gate CMOS comprising the steps of:

(a) forming a polycrystalline silicon film doped with boron over a gate insulating film containing a silicon oxide film formed over a silicon surface of a majbr surface of a semiconductor wafer;

(b) forming a refractory metal film mainly comprising tungsten over the polycrystalline silicon film via a barrier layer containing tungsten nitride;

(c) forming a gate electrode by patterning the polycrystalline silicon film, the barrier layer and the refractory metal film; and (d) after the step (c), subjecting the silicon surface and the polycrystalline silicon film positioned in a part corresponding to an edge part of the gate electrode to a thermal oxidation treatment in a mixed gas atmosphere containing a hydrogen gas and steam so as substantially not to oxidize the refractory metal film, whereby compensating the silicon film under the edge part of the gate electrode that has been etched on patterning in the step (c).

14. A process for producing a semiconductor integrated circuit device having a dual gate CMOS comprising the steps of:

(a) forming a polycrystalline silicon film doped with boron over a gate insulating film containing a silicon oxide film formed over a silicon surface of a major surface of a semiconductor wafer;

(b) forming a refractory metal film mainly comprising tungsten over the polycrystalline silicon film via a barrier layer containing tungsten nitride; (c) forming a gate electrode by patterning the polycrystalline silicon film, the barrier layer and the refractory metal film; and (d) after the step (c), subjecting the silicon surface and the polycrystalline silicon film positioned in a part corresponding to an edge part of the gate electrode to a thermal oxidation treatment in a mixed gas atmosphere containing a hydrogen gas and steam synthesized from an oxygen gas and a hydrogen gas so as substantially not to oxidize the refractory metal film, whereby compensating the silicon film under the edge part of the gate electrode that has been etched on patterning in the step (c).

15. A process for producing a semiconductor integrated circuit device comprising the steps of:

(a) forming a polycrystalline silicon film doped with boron over a gate insulating film containing a silicon oxide film formed over a silicon surface of a major surface of a semiconductor wafer;

(b) forming a refractory metal film mainly comprising tungsten over the polycrystalline silicon film directly or via a barrier layer;

(c) forming a gate electrode by patterning the polycrystalline silicon film and the refractory metal film; and (d) after the step (c), subjecting the silicon surface and the polycrystalline silicon film positioned in a part corresponding to an edge part of the gate electrode to a thermal oxidation treatment in a mixed gas atmosphere containing a hydrogen gas and steam synthesized from an oxygen gas and a hydrogen gas.

16. A semiconductor integrated circuit having a dual gate CMOS comprising a gate insulating film containing a silicon oxide film formed over a silicon surface of a first major surface of a semiconductor integrated circuit wafer, having thereover a polycrystalline silicon film doped with boron and a refractory metal film laminated over the polycrystalline silicon film directly or via a barrier layer, wherein the gate insulating film is formed beyond an edge part of the polycrystalline silicon film constituting a part of the gate electrode.

17. A semiconductor integrated circuit having a dual gate CMOS comprising a gate insulating film containing a thermal oxide film over a silicon surface of a first major surface of a semiconductor integrated circuit wafer, having thereover a polycrystalline silicon film doped with boron and a refractory metal film laminated over the polycrystalline silicon film directly or via a barrier layer, wherein in the gate insulating film, the thickness of the thermal oxide film formed under an edge part of the gate electrode is larger than the thickness of the thermal oxide film formed under a central part of the gate electrode.

18. A semiconductor integrated circuit having a dual gate CMOS comprising a gate insulating film containing a silicon oxide film formed over a silicon surface of a first major surface of a semiconductor integrated circuit wafer, having thereover a polycrystalline silicon film doped with boron and a refractory metal film laminated over the polycrystalline silicon film directly or via a barrier layer, wherein the silicon oxide film formed under an edge part of the gate electrode has such a round shape that prevents concentration of an electric field.

19. A semiconductor integrated circuit having a dual gate CMOS comprising a gate insulating film containing a silicon oxide film formed over a silicon surface of a first major surface of a semiconductor integrated circuit wafer, having thereover a polycrystalline silicon film doped with boron and a refractory metal film laminated over the polycrystalline silicon film directly or via a barrier layer, wherein an edge part and a lower surface of the polycrystalline silicon film constituting a part of the gate electrode are covered with the thermal oxide film.

20. A semiconductor integrated circuit device as in the item 19, wherein the gate insulating film contains a silicon oxinitride film.

21. A process for producing a semiconductor integrated circuit device comprising the steps of: after forming, over a gate oxide film formed over a major surface of a semiconductor substrate, a conductive film comprising a polycrystalline silicon film doped with boron laminated with a high melting point film directly or via a barrier layer, forming a gate electrode of an MOSFET by patterning the conducting film; and conducting a heat treatment process by supplying a mixed gas containing a hydrogen gas and steam synthesized from an oxygen gas and a hydrogen gas with a catalyst to the major surface of the semiconductor substrate or a vicinity thereof, to selectively oxidize the major surface of the semiconductor substrate, whereby improving a profile of the gate oxide film under an edge part of the gate electrode that has been etched on the patterning, wherein said heat treatment is conducted under a condition in that the refractory metal film is substantially not oxidized, and boron contained in the polycrystalline silicon film constituting a part of the gate electrode is not diffused to the semiconductor substrate through the gate oxide film.

22. A process for producing a semiconductor integrated circuit device as in the item 21, wherein the refractory metal film comprises tungsten, and the barrier layer comprises tungsten nitride.

23. A process for producing a semiconductor integrated circuit device as in the item 21, wherein the gate oxide film under a central part of the gate electrode has a thickness of 3.5 nm or less.

24. A process for producing a semiconductor integrated circuit device as in the item 21, wherein the gate electrode has a gate length of 0.18 µm or less.

25. A process for producing a semiconductor integrated circuit device as in the item 22, wherein the heat treatment is conducted at a temperature of from 650 to 900° C.

26. A process for producing a semiconductor integrated circuit device as in the item 22, wherein the heat treatment is conducted at a temperature of from 750 to 900° C.

27. A process for producing a semiconductor integrated circuit device as in the item 22, wherein the heat treatment is conducted at a temperature of about 850° C.

28. A process for producing a semiconductor integrated circuit device as in the item 26, wherein the mixed gas has a moisture concentration of from 1 to 50%.

29. A process for producing a semiconductor integrated circuit device as in the item 27, wherein the mixed gas has a moisture concentration of about 50%.

30. A process for producing a semiconductor integrated circuit device as in the item 22, wherein the mixed gas has a reduced pressure of 700 Torr or less.

31. A process for producing a semiconductor integrated circuit device as in the item 22, wherein the mixed gas has a normal pressure of from 700 to 800 Torr.

32. A process for producing a semiconductor integrated circuit device as in the item 22, wherein the mixed gas has a positive pressure of 800 Torr or more.

33. A process for producing a semiconductor integrated circuit device comprising the steps of:
  (a) after forming a gate oxide film over a major surface of a semiconductor substrate, forming a polycrystalline silicon film over the gate oxide film;
  (b) forming a p-type polycrystalline silicon film by doping the polycrystalline silicon film in a first region of the semiconductor substrate with a p-type impurity containing boron, and forming an n-type polycrystalline silicon film by doping the polycrystalline silicon film in a second region of the semiconductor substrate with an n-type impurity;
  (c) forming a refractory metal film over each of the p-type polycrystalline silicon film and the n-type polycrystalline silicon film directly or via a barrier layer;
  (d) by patterning the p-type polycrystalline silicon film, the n-type polycrystalline silicon film and the refractory metal film formed thereon, forming a first gate electrode of a p-channel MOSFET constituted by the p-type polycrystalline silicon film and the refractory metal film in the first region of the semiconductor substrate, and forming a second gate electrode of an n-channel MOSFET constituted by the n-type polycrystalline silicon film and the refractory metal film in the second region of the semiconductor substrate; and
  (e) conducting a heat treatment process by supplying a mixed gas containing a hydrogen gas and steam synthesized from an oxygen gas and a hydrogen gas with a catalyst to the major surface of the semiconductor substrate or a vicinity thereof, to selectively oxidize the major surface of the semiconductor substrate in a condition in that the refractory metal film constituting a part of each of the first gate electrode and the second gate electrode is substantially not oxidized, and boron contained in the p-type polycrystalline silicon film constituting another part of the first gate electrode is not diffused into the semiconductor substrate through the gate oxide film, whereby improving a profile of the gate oxide film under edge parts of each of the first gate electrode and the second gate electrode that has been etched on the patterning.

34. A process for producing a semiconductor integrated circuit device as in the item 33, wherein the refractory metal film comprises tungsten, and the barrier layer comprises tungsten nitride.

35. A process for producing a semiconductor integrated circuit device as in the item 33, wherein the gate oxide film under central parts of each of the first gate electrode and the second gate electrode has a thickness of 3.5 nm or less.

36. A process for producing a semiconductor integrated circuit device as in the item 33, wherein each of the first gate electrode and the second gate electrode has a gate length of 0.18 µm or less.

Furthermore, the substance of another aspect of the invention will be described below.

37. A process for producing an integrated circuit device comprising the steps of:
  (a) forming a first region mainly comprising silicon doped with boron over a first insulating film over a first major surface of a semiconductor wafer; and
  (b) conducting a thermal oxidation treatment to the first region in a mixed gas atmosphere containing a hydrogen gas and steam in a condition in that a refractory metal region on the first major surface is substantially not oxidized.

38. A process for producing an integrated circuit device as in the item 37, wherein the refractory metal region is formed over the first region.

39. A process for producing an integrated circuit device as in the item 38, wherein the mixed gas atmosphere contains a nitrogen gas.

40. A process for producing an integrated circuit device as in the item 39, wherein the doping of boron is conducted by implantation of an ion into the first region.

41. A process for producing a semiconductor integrated circuit device having a dual gate CMOS comprising the steps of:
  (a) forming a polycrystalline silicon film over a gate insulating film containing a silicon oxide film formed over a silicon surface of a major surface of a semiconductor wafer;
  (b) forming a refractory metal film over the polycrystalline silicon film via a barrier layer;
  (c) forming a gate electrode by patterning the polycrystalline silicon film, the barrier layer and the refractory metal film; and
  (d) after the step (c), subjecting the polycrystalline silicon film to a thermal oxidation treatment in a mixed gas atmosphere containing a hydrogen gas and steam and having a moisture concentration in a range of from 5% to such a maximum concentration that the refractory metal film is substantially not oxidized.

42. A process for producing a semiconductor integrated circuit device having a dual gate CMOS as in the item 41, wherein the moisture concentration of the mixed gas atmosphere is from 8 to 25% (from 8.7% to 33% in the partial pressure representation).

BRIEF DESCRIPTION OF THE DRAWINGS

FIG. 17 is a graph showing the relationship between the temperature on subjecting the gate electrode-to the heat treatment and $V_{FB}$.

FIG. 18 is a diagram showing the sequence of the light oxidation process using a single wafer processing oxidation furnace.

DETAILED DESCRIPTION OF THE INVENTION

Embodiments of the invention will be described in detail with reference to the drawings. In all the figures describing the various embodiments, the same symbol is used to identify members having the same function, and repeated explanation of those members is omitted. In the following embodiments, explanation of the same or a similar part is not repeated unless it is particularly necessary.

Furthermore, for purposes of convenience, the following description is divided into plural sections or embodiments, and, unless otherwise clearly indicated, they are not unrelated to each other, but one is in a relationship of a modification, a detail or an additional description of a part or the whole of the other. In the following description, in the case where a number of an element (including numbers, values, amounts and ranges) is referred to, it is to be understood that the invention is not limited to the particular value, but it may use more than or less than the particular value, except for the case where it is clearly indicated or it is theoretically clear that it is limited the particular value. Furthermore, in the following embodiments, a constitutional element (including an elemental step) is not always necessary except in the case where it is clearly indicated or it is theoretically clear that it is necessary.

Similarly, in the following embodiments, in the case where a shape or a positional relationship of a constitutional element is referred to, the shape or positional relationship substantially includes those which are close to or resemble it, except for the case where it is clearly indicated or it is theoretically clear that it is not included.

The semiconductor integrated circuit device according to the invention includes not only those produced on a silicon wafer, but also those produced on the other substrates, such as a TFT liquid crystal, except for) the case where it is clearly indicated that those are not included.

Furthermore, the semiconductor wafer referred to in the description of the invention includes not only a single crystal semiconductor, such as a silicon single crystal wafer, or those obtained by forming conductive or semiconductor films directly on or via an insulating film having a multilayer structure, but also those obtained by forming a semiconductor part, a conductive film part and an insulating film part on a wafer of an insulating material.

Figure 1:
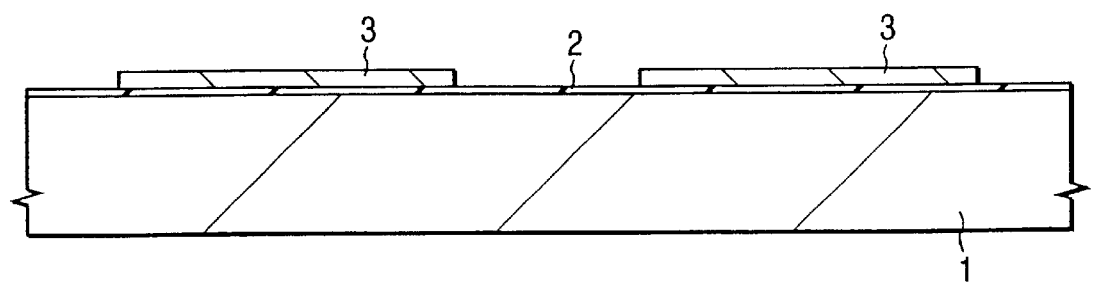
FIG. 1 is a partial cross sectional view of a semiconductor substrate showing a step in the process for producing a CMOS LSI representing an embodiment of the invention.

In this embodiment, the invention is applied to a process for producing a CMOS LSI, the integrated circuit of which is constituted by an n-channel MISFET and a p-channel MISFET. On producing the CMOS LSI, as shown in FIG. 1, a semiconductor substrate 1 comprising single crystal silicon having a specific resistance of about 10 Ω cm is subjected to a heat treatment at about 850° C. to form a thin silicon oxide film 2 (pad oxide film) having a film thickness of about 10 nm on the major surface thereof, and a silicon nitride film 3 having a film thickness of about 120 nm is accumulated on the silicon oxide film 2 by a CVD (chemical vapor deposition) method, followed by removing the silicon nitride film 3 and the silicon oxide film 2 in an element isolation region by etching using a photoresist film as a mask. The silicon oxide film 2 is formed to relax the stress applied to the substrate on densifying a silicon oxide film embedded inside the element isolation groove in a later step. Since the silicon nitride film 3 has characteristics which make it difficult to be oxidized, it is utilized as a mask for preventing oxidation of the substrate surface thereunder (active region).

Figure 2:
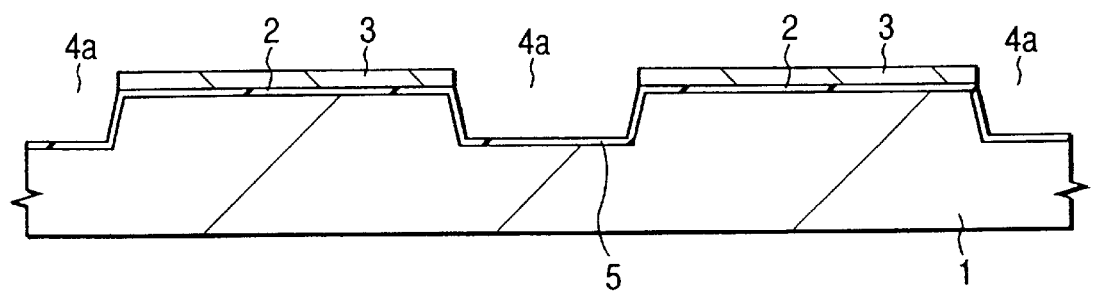
FIG. 2 is a partial cross sectional view of a semiconductor substrate showing a step in the process for producing the CMOS LSI.

Thereafter, as shown in FIG. 2, a groove 4a having a depth of about 350 nm is formed on the semiconductor substrate 1 in the element isolation region by dry etching using the silicon nitride film 3 as a mask, and in order to avoid a damaged layer being formed on an inner wall of the groove 4 during etching, the semiconductor substrate 1 is subjected to a heat treatment at about 1,000° C. to form a thin silicon oxide film 5 having a film thickness of about 10 nm on the inner wall of the groove 4a.

Figure 3:
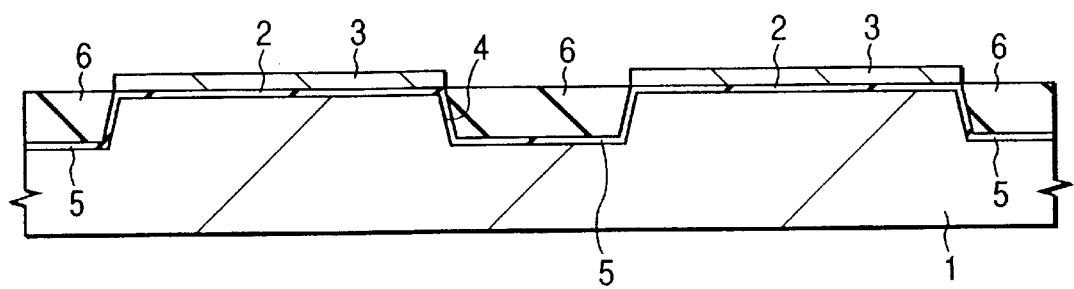
FIG. 3 is a partial cross sectional view of a semiconductor substrate showing a step in the process for producing the CMOS LSI.

Thereafter, as shown in FIG. 3, a silicon oxide film 6 having a film thickness of about 380 nm is accumulated on the semiconductor substrate 1, and in order to improve the film quality of the silicon oxide film 6, the semiconductor substrate 1 is subjected to a heat treatment to densify the silicon oxide film 6. Then, the silicon oxide film 6 is polished by a chemical mechanical polishing (CMP) method by using the silicon nitride film 3 as a stopper to leave it inside the groove 4a, so as to form an element isolation having a flattened surface 4. When the mechanical flattening of a major surface (surface on which an element is formed) of a wafer (substrate) is the referred to in this description, it is not limited to use of a CMP method using suspended abrasive grains, but includes a similar flattening technique using fixed abrasive grains and an intermediate form.

Figure 4:
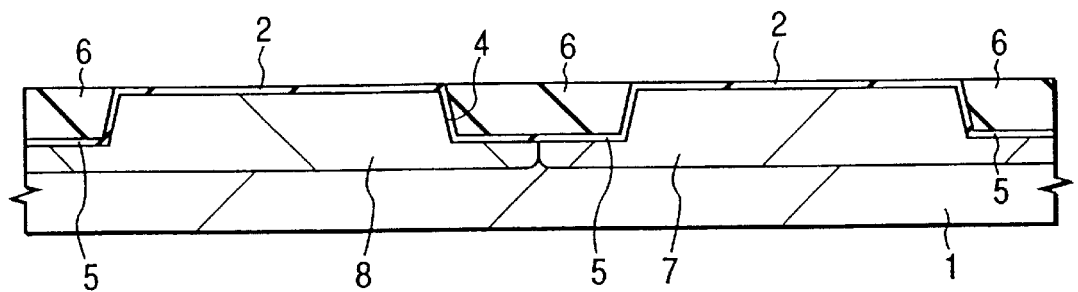
FIG. 4 is a partial cross sectional view of a semiconductor substrate showing a process step in the for producing the CMOS LSI.

Then, after the silicon nitride film 3 remaining in the active region of the semiconductor substrate 1 is removed by wet etching using hot phosphoric acid, a p-type well 7 is formed by ion implantation of B (boron) into the region of the semiconductor substrate 1, at which an n-channel MISFET is formed, and an n-type well 8 is formed by ion implantation of P (phosphorous) into the region, at which a p-channel MISFET is formed, as shown in FIG. 4.

Thereafter, ion implantation of B (boron) for adjusting the threshold voltage ($V_{th}$) of the n-channel MISFET is conducted into the p-type well 7, and ion implantation of P (phosphorous) for adjusting the threshold voltage ($V_{th}$) of the p-channel MISFET is conducted into the n-type well 8.

Figure 5:
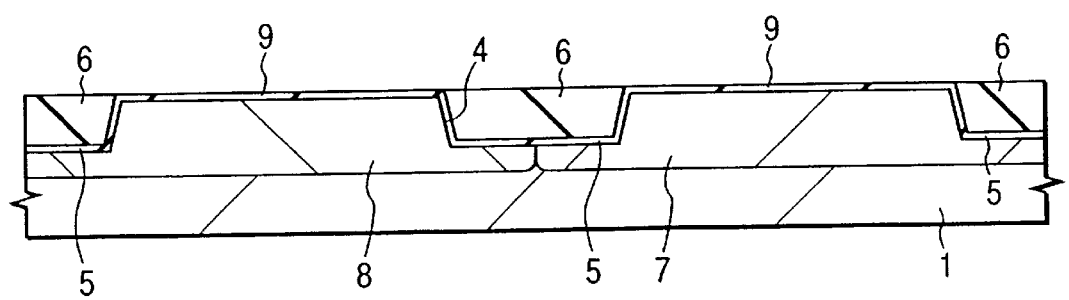
FIG. 5 is a partial cross sectional view of a semiconductor substrate showing a step in the process for producing the CMOS LSI.

Then, as shown in FIG. 5, the silicon oxide film 2 on each of the p-type well 7 and the n-type well 8 is removed by using an HF (hydrofluoric acid) series cleaning solution, and the semiconductor substrate 1 is subjected to wet oxidation to form a clean gate oxide film 9 having a film thickness about 3.5 nm on the surface of each of the p-type well 7 and the CMP n-type well 8.

While the invention is not particularly so limited, after forming the gate oxide film 9, an oxinitrification treatment to segregate nitrogen at the interface between the gate oxide film 9 and the semiconductor substrate 1 may be conducted by subjecting the semiconductor substrate 1 to a heat treatment in an NO (nitrogen oxide) or $N_2O$ (nitrous oxide) atmosphere. When the gate oxide film 9 is thinned to about 3.5 nm, the stress formed at the interface therebetween due to the difference in heat expansion coefficient from the semiconductor substrate 1 becomes tangible to induce generation of a hot carrier. Nitrogen segregated at the interface to the semiconductor substrate 1 relaxes the stress, and thus the oxinitrification treatment improves the reliability of the extremely thin gate oxide film 9.

Figure 6:
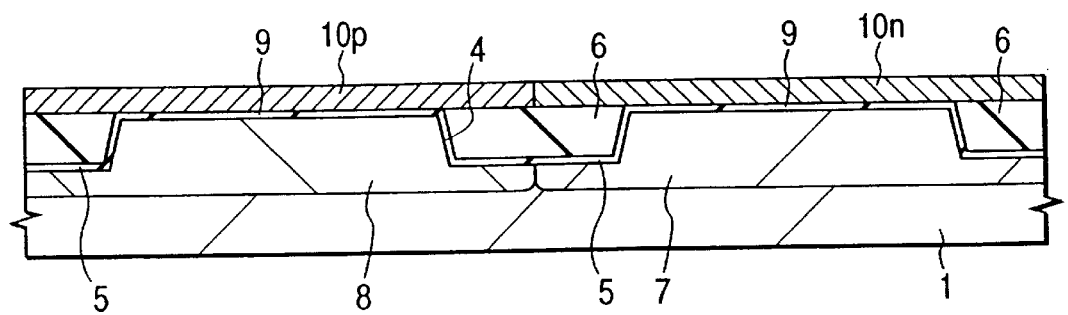
FIG. 6 is a partial cross sectional view of a semiconductor substrate showing a step in the process for producing the CMOS LSI as an embodiment of the invention.

Then, as shown in FIG. 6, after a non-doped polycrystalline silicon film having a film thickness about 90 to 100 nm is accumulated on the semiconductor substrate 1 by a CVD method, ion implantation of P (phosphorous) is conducted into the non-doped polycrystalline silicon film in the region, at which an n-channel MISFET is formed (p-type well 7), to form an n-type polycrystalline silicon film 10n, and ion implantation of B (boron) is conducted into the non-doped polycrystalline silicon film in the region, at which an p-channel MISFET is formed (n-type well 8), to form an p-type polycrystalline silicon film 10p.

Figure 7:
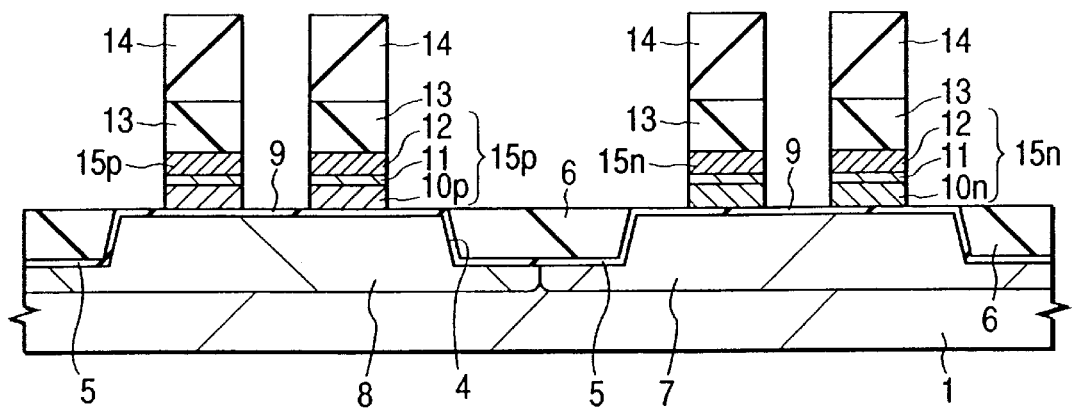
FIG. 7 is a partial cross sectional view of a semiconductor, substrate showing a step in the process for producing the CMOS LSI.

Then, as shown in FIG. 7, a WN film 11 having a film thickness of about 5 nm and a W film 12 having a film thickness of about 50 nm are accumulated on the n-type polycrystalline silicon film ion and the p-type polycrystalline silicon film 10p by a sputtering method, and after a silicon nitride film 13 having a film thickness of about 200 nm is formed on the W film 12, these films are subjected to dry etching by using a photoresist film 14 formed on the silicon nitride film 13 as a mask. Accordingly, a gate electrode 15n of an n-channel MISFET comprising the n-type polycrystalline silicon film 10n, the WN film 11 and the W film 12 is formed on the gate oxide film 9 of the p-type well 7, and a gate electrode 15p of a p-channel MISFET comprising the p-type polycrystalline silicon film 10p, the WN film 11 and the W film 12 is formed on the gate oxide film 9 of the n-type well 8. The gate length of each of the gate electrode 15n and the gate electrode 15p is, for example, 0.18 µm.

As described above, by using a polymetal structure, in which a part of each of the gate electrode 15n of the n-channel MISFET and the gate electrode 15p of the p-channel MISFET is constituted by a low resistance metal (W), the sheet resistance thereof can be decreased to about 2 Ω per square, and thus high speed operation can be realized by controlling the gate delay of the CMOS circuit.

Figure 8:
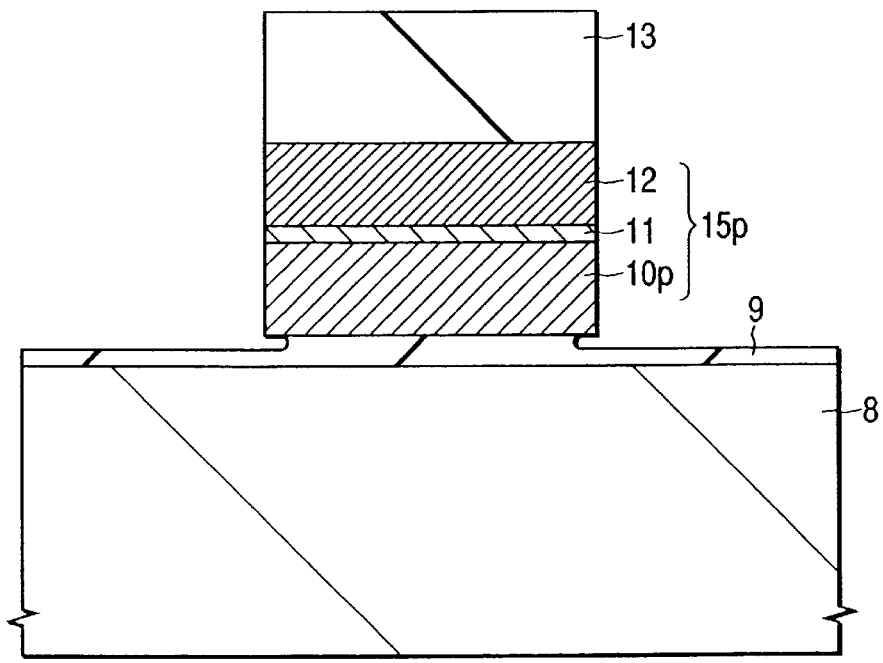
FIG. 8 is a partial enlarged cross sectional view of a semiconductor substrate showing a step in the process for producing the CMOS LSI.

Thereafter, the photoresist film 14 used for processing the gate electrodes 15n and 15p is removed by an ashing treatment, and then a dry etching residue and an ashing residue remaining on the surface of the semiconductor substrate 1 are removed by using an etching solution such as hydrofluoric acid. After conducting such wet etching, as shown in FIG. 8, the gate oxide film 9 in a region other than that under the gate electrode 15n (the same as in the gate electrode 15p) is thinned so that the thickness thereof is decreased to about a half of that before the etching, and at the same time, the gate oxide film 9 under the side wall of the gate is also isotropically etched to form an undercut. Therefore, problems occur as it stands, such as a decrease in the resisting voltage of the gate electrodes 15n and 15p. In order to compensate and regenerate the gate oxide film 9 that has been cut by the wet etching, a re-oxidation (light oxidation) treatment is conducted according to the following method. With respect to the light oxidation treatment, detailed descriptions are found in Japanese Patent Application No. 9-142315 (corresponding to U.S. application Ser. No. 09/086,568 filed on May 29, 1998).

Figure 9A:
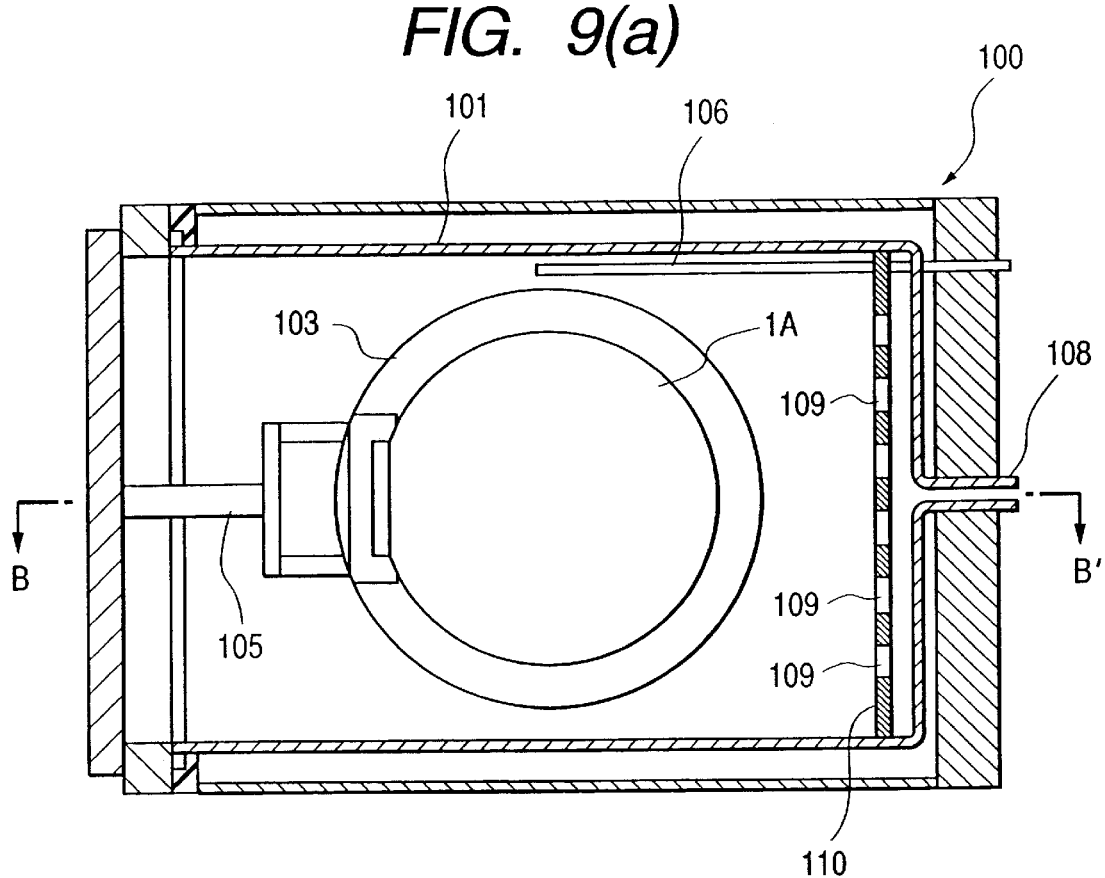
FIG. 9(a) is a schematic plan view showing a single wafer processing oxidation furnace used for the light oxidation process.
Figure 9B:
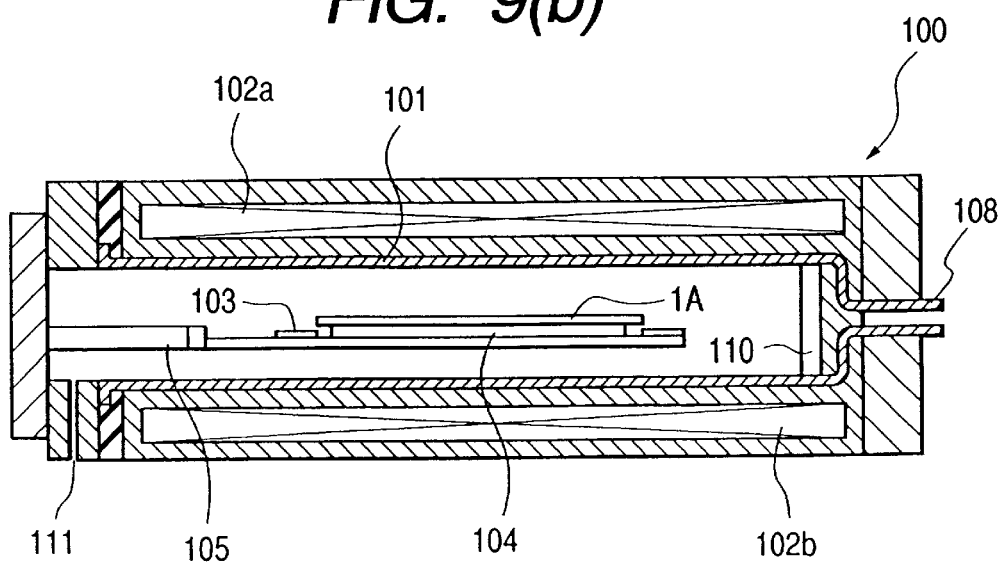
FIG. 9(b) is a cross sectional view taken on line B–B' in FIG. 9(a).

FIG. 9(a) is a schematic plan view showing an example of a specific constitution of a single wafer processing oxidation furnace used for the light oxidation process, and FIG. 9(b) is a cross sectional view taken on line B–B' in FIG. 9(a).

Figure 10A:
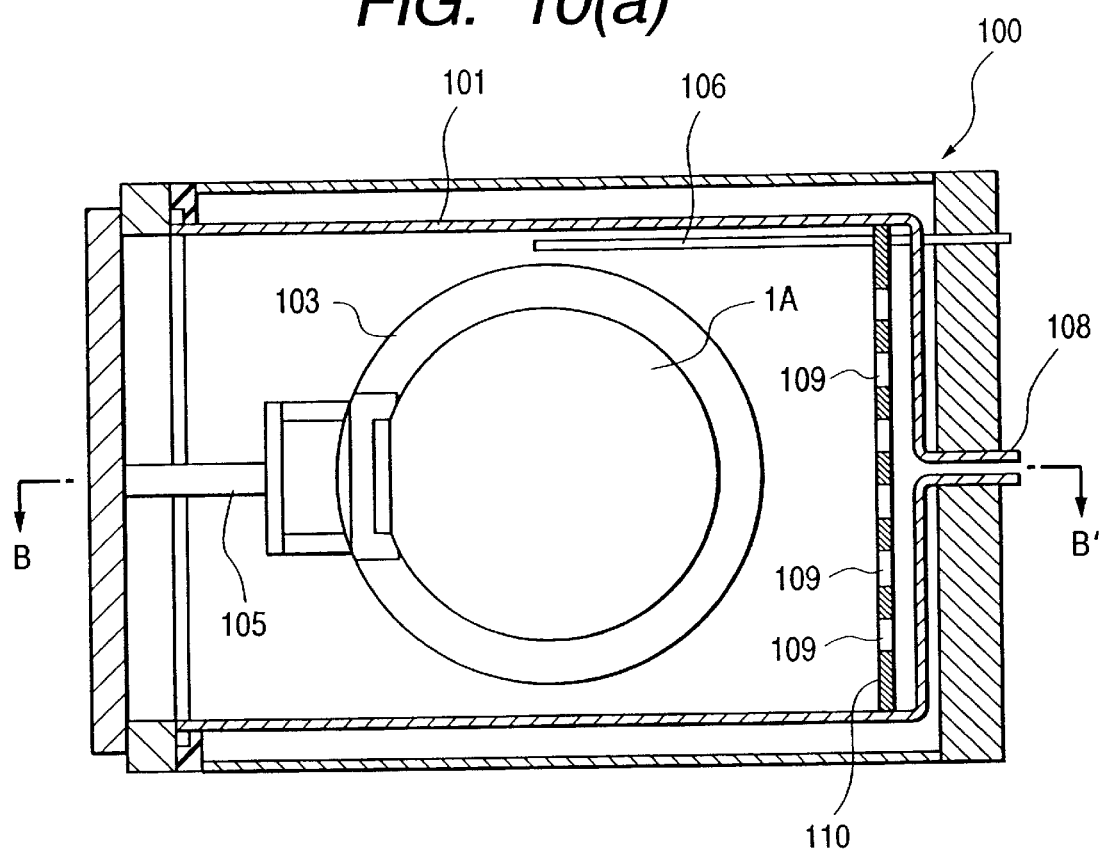
FIG. 10(a) is a schematic plan view showing a single wafer processing oxidation furnace used for the light oxidation process.
Figure 10B:
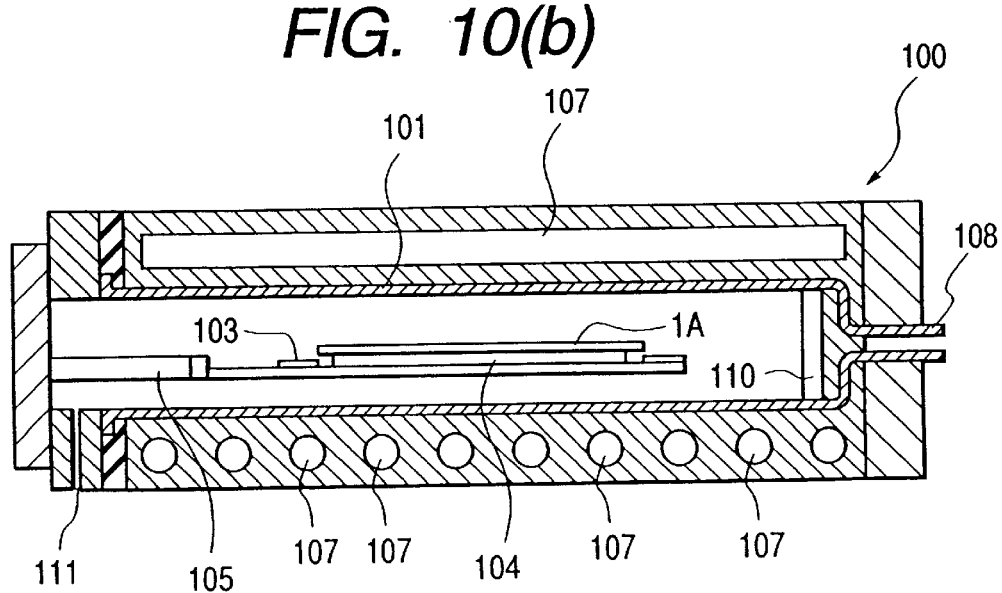
FIG. 10(b) is a cross sectional view taken on line B–B' in FIG. 10(a).

The single wafer processing oxidation furnace 100 comprises a chamber 101 constituted by a multiple wall quartz tube, which has heaters 102a and 102b for heating a semiconductor wafer 1A at an upper part and a lower part thereof, respectively. A heat flattening ring 103 having a disk shape that is able to uniformly disperse heat supplied from the heaters 102a and 102b to the hole surface of the semiconductor wafer 1A is installed in the chamber 101, and a susceptor 104 horizontally holding the semiconductor wafer 1A is provided at an upper part thereof. The heat flattening ring 103 is constituted by a heat resistant material such as quartz and SiC (silicon carbide) and is supported by a supporting arm 105 extending from a wall of the chamber 101. A thermoelectric couple 106 for measuring the temperature of the semiconductor wafer 1A supported by the susceptor 104 is provided in the vicinity of the heat flattening ring 103. The heating of the semiconductor wafer 1A may be conducted, for example, by an RTA (rapid thermal annealing) method using a halogen lamp 107 as shown in FIG. 10(b), as well as the heating method using the heaters 102a and 102b.

One end of a gas introducing conduit 108 for introducing a steam/hydrogen mixed gas and a purge gas into the chamber 101 is connected to a part of the wall of the chamber 101. To the other end of the gas introducing conduit 108, a gas generating device of a catalyst type described later is connected. A partition 110 having numerous through holes 109 is provided in the vicinity of the gas introducing conduit 108, and the gas introduced into the chamber 101 is uniformly spread throughout the chamber 101 passing through the through holes 109 of the partition 110. One end of an exhausting conduit 111 for evacuating the gas introduced into the chamber 101 is connected to the other part of the wall of the chamber 101.

Figure 11:
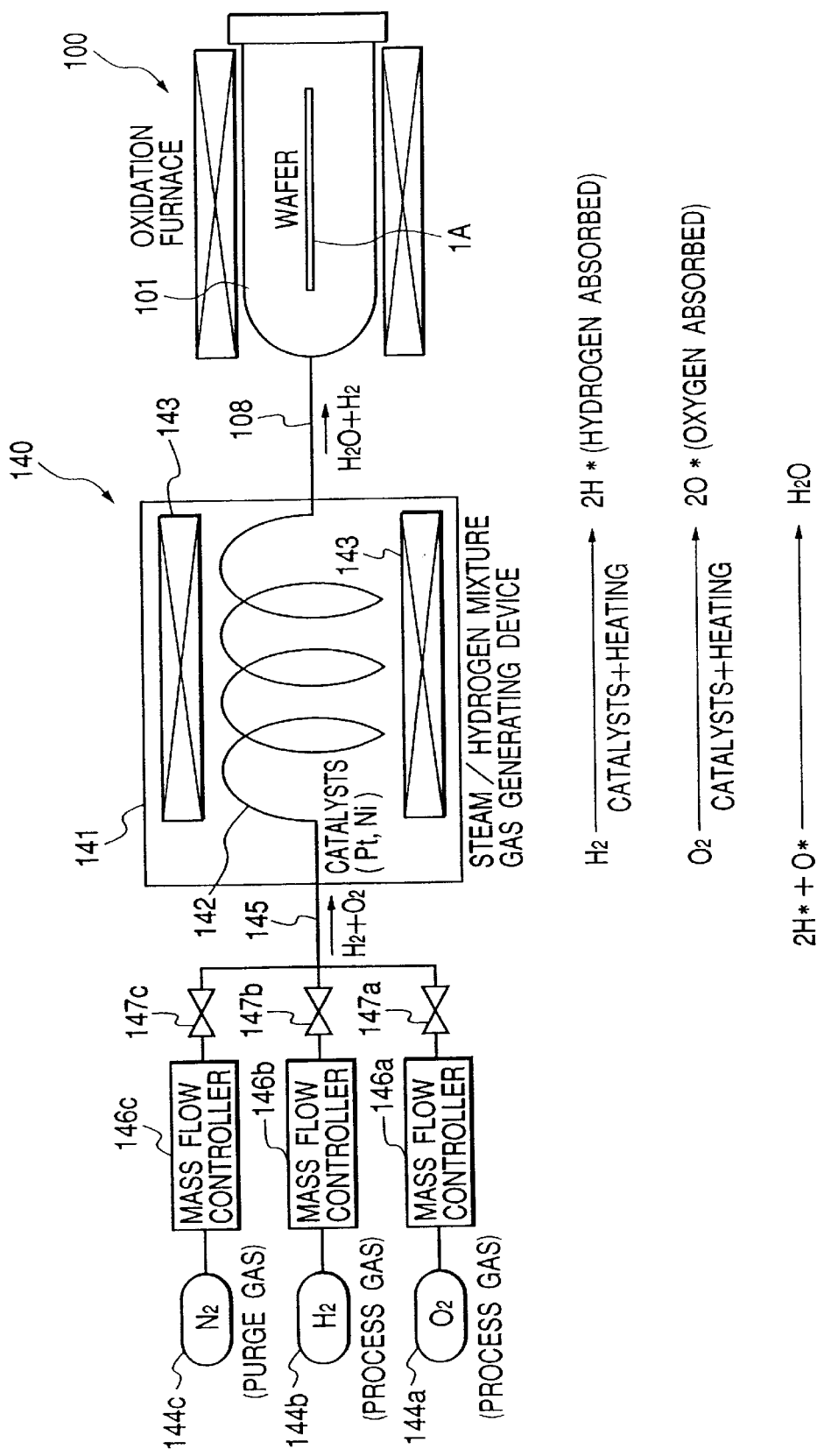
FIG. 11 is a schematic diagram showing a device for generating a steam/hydrogen mixed gas of a catalyst type used in one embodiment of the invention.
Figure 12:
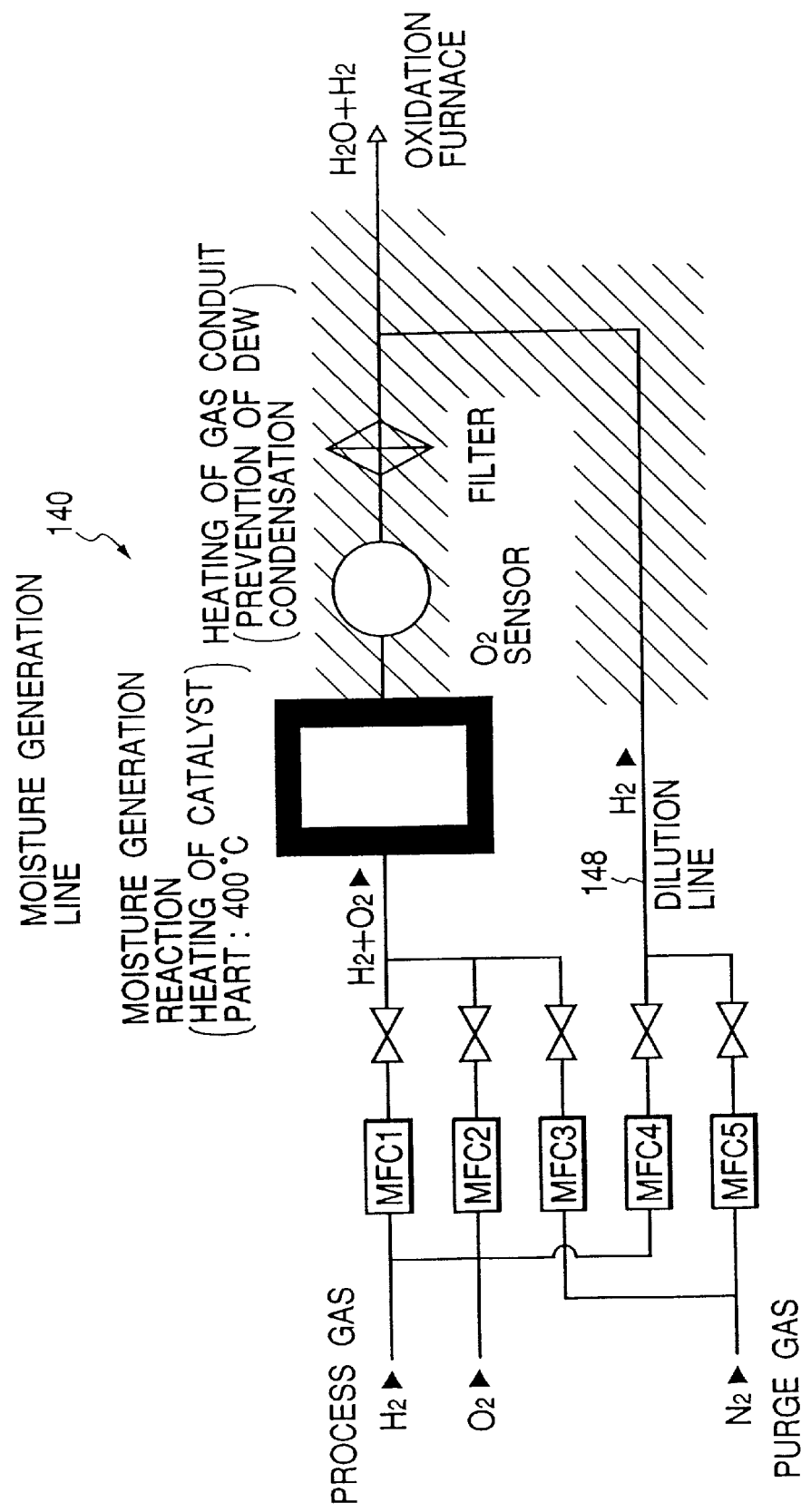
FIG. 12 is a diagram showing a conduit system of the device for generating a steam/hydrogen mixed gas shown in FIG. 11.

FIG. 11 is a schematic diagram showing a device for generating a steam/hydrogen mixed gas of a catalyst type connected to the chamber 101 of the single wafer processing oxidation furnace 100. FIG. 12 is a diagram showing a conduit system of the gas generating device. The gas generating device 140 comprises a reactor 141 constituted by a heat resistant and corrosion resistant alloy (for example, an Ni alloy known as "Hastelloy", a trade name), and a coil 142 comprising a catalyst metal, such as Pt (platinum), Ni (nickel) or Pd (palladium), and a heater 143 for heating the coil 142, which are installed inside the reactor.

A process gas comprising hydrogen and oxygen, and a purge gas comprising an inert gas, such as nitrogen or Ar (argon), are introduced into the reactor 141 from gas storage tanks 144a, 144b and 144c through a conduit 145. Mass flow controllers 146a, 146b and 146c for controlling the amounts of the gases and switching valves 147a, 147b and 147c are provided between the gas storage tanks 144a, 144b and 144c and the conduit 145, to precisely control the amounts and compositional ratio of the gases introduced into the reactor 141.

The process gas (hydrogen and oxygen) introduced into the reactor 141 is excited by contacting the coil 142 heated to a temperature of about from 350 to 450° C., so that a hydrogen radical is formed from a hydrogen molecule ($H_2 \rightarrow 2H^*$), and an oxygen radical is formed from an oxygen molecule ($O_2 \rightarrow 2O^*$). The two kinds of radicals are extremely chemically active, and thus rapidly react to form water ($2H^* + O^* \rightarrow H_2O$). Thus, a steam/hydrogen mixed gas is formed by introducing a process gas containing hydrogen in an amount in excess of the molar ratio forming water (steam) (hydrogen/oxygen=2/1) into the reactor 141. The mixed gas is mixed with hydrogen supplied from a dilution line 148 shown in FIG. 12 to adjust to a steam/hydrogen mixed gas having a desired moisture concentration, and then the mixed gas is introduced into the chamber 101 of the single wafer processing oxidation furnace 100 through the gas introducing conduit 108. The mixed gas may be introduced into the chamber 101 after being diluted with an inert gas, such as nitrogen and argon, to a suitable concentration. The pressure of the mixed gas may be arbitrarily set within the range of from several tens of Torr to several atm.

Because the gas generating device 140 of a catalyst type can precisely control the amounts of hydrogen and oxygen participating in the formation of and their ratio, the steam concentration in the steam/hydrogen mixed gas introduced into the chamber 101 can be precisely controlled within a wide range of from an extremely low concentration of a ppm order to a high concentration of several tens percent. Because water is instantaneously formed when the process gas is introduced into the reactor 141, a steam/hydrogen mixed gas having a desired steam concentration can be obtained in a real-time manner. By using such a process, because inclusion of foreign matter is suppressed to a minimum, a clean steam/hydrogen mixed gas can be introduced into the chamber 101.

The catalyst metal in the reactor 141 is limited to the metals described above, but other metals may be used so long as they can form radicals from hydrogen and oxygen. The catalyst metal may be provided a coil form, and it may be worked into the form of a hollow tube or a fine fibrous filter, through which the process gas may be passed.

Figure 13:
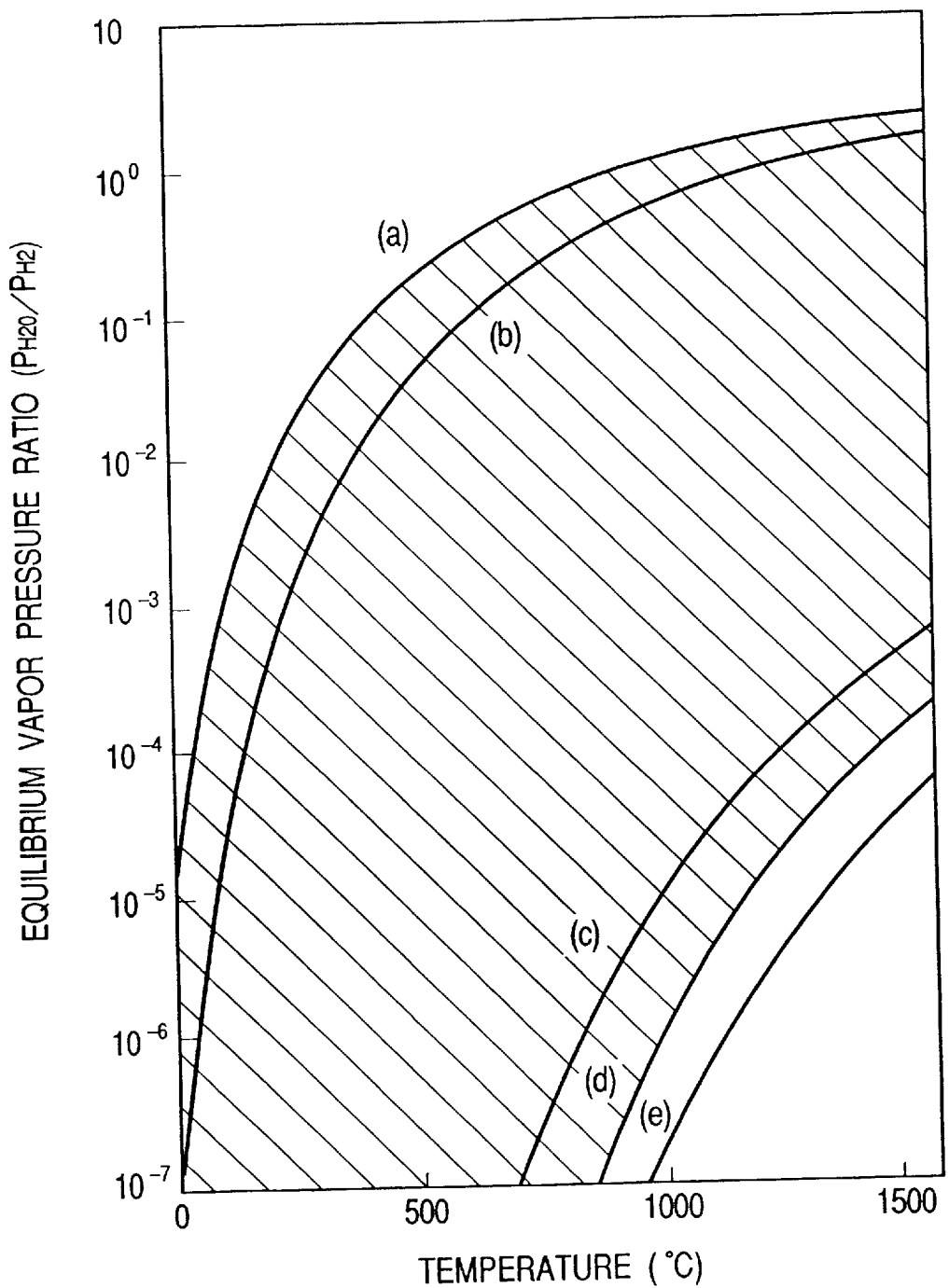
FIG. 13 is a graph showing the dependency of the equilibrium vapor pressure ratio of the redox reaction using steam/hydrogen mixed gas on the temperature.

FIG. 13 is a graph showing the dependency of the equilibrium vapor pressure ratio ($P_{H2O}/P_{H2}$) of the redox reaction using the steam/hydrogen mixed gas on the temperature, in which the curves (a) to (e) in the figure indicate the equilibrium vapor pressure ratios of W, Mo, Ta (tantalum), Si and Ti, respectively.

As shown in the figure, only Si (the semiconductor substrate 1 and the polycrystalline silicon films 10n and 10p) can be selectively oxidized without oxidizing the W film 12 constituting the gate electrodes 15n and 15p and the WN film 11 as a barrier layer in such a manner that the steam/hydrogen partial pressure ratio of the steam/hydrogen mixed gas introduced into the chamber 101 of the single wafer processing oxidation furnace 100 is set within the range of the region between the curve (a) and the curve (d). Furthermore, as shown in the figure, the oxidation rate is increased by increasing the steam concentration in the steam/hydrogen mixed gas in all the cases of the metals (W, Mo, Ta and Ti) and Si. That is, by increasing the steam concentration in the steam/hydrogen mixed gas, Si can be selectively oxidized in a shorter period of time.

Similarly, in the case where the refractory metal part of the gate electrodes 15n and 15p is constituted by an Mo film, only Si can be selectively oxidized without oxidizing the Mo film in such a manner that the steam/hydrogen partial pressure ratio is set within the range of the region between the curve (b) and the curve (d). In the case where a part of the gate electrodes 15n and 15p is constituted by a Ta film, only Si can be selectively oxidized without oxidizing the Ta film in such a manner that the steam/hydrogen partial pressure ratio is set within the range of the region between the curve (c) and the curve (d).

On the other hand, because Ti exhibits a higher oxidation rate than Si in the steam/hydrogen mixed gas as shown in the figure, in the case where the metal part of the gate electrodes 15n and 15p is constituted by a Ti film or the barrier layer is constituted by a TiN film, even though an attempt is made to selectively oxidize only Si (the semiconductor substrate 1 and the polycrystalline silicon films 10n and 10p), the Ti film and the TiN film are simultaneously oxidized to cause peeling of the gate electrode.

Figure 14:
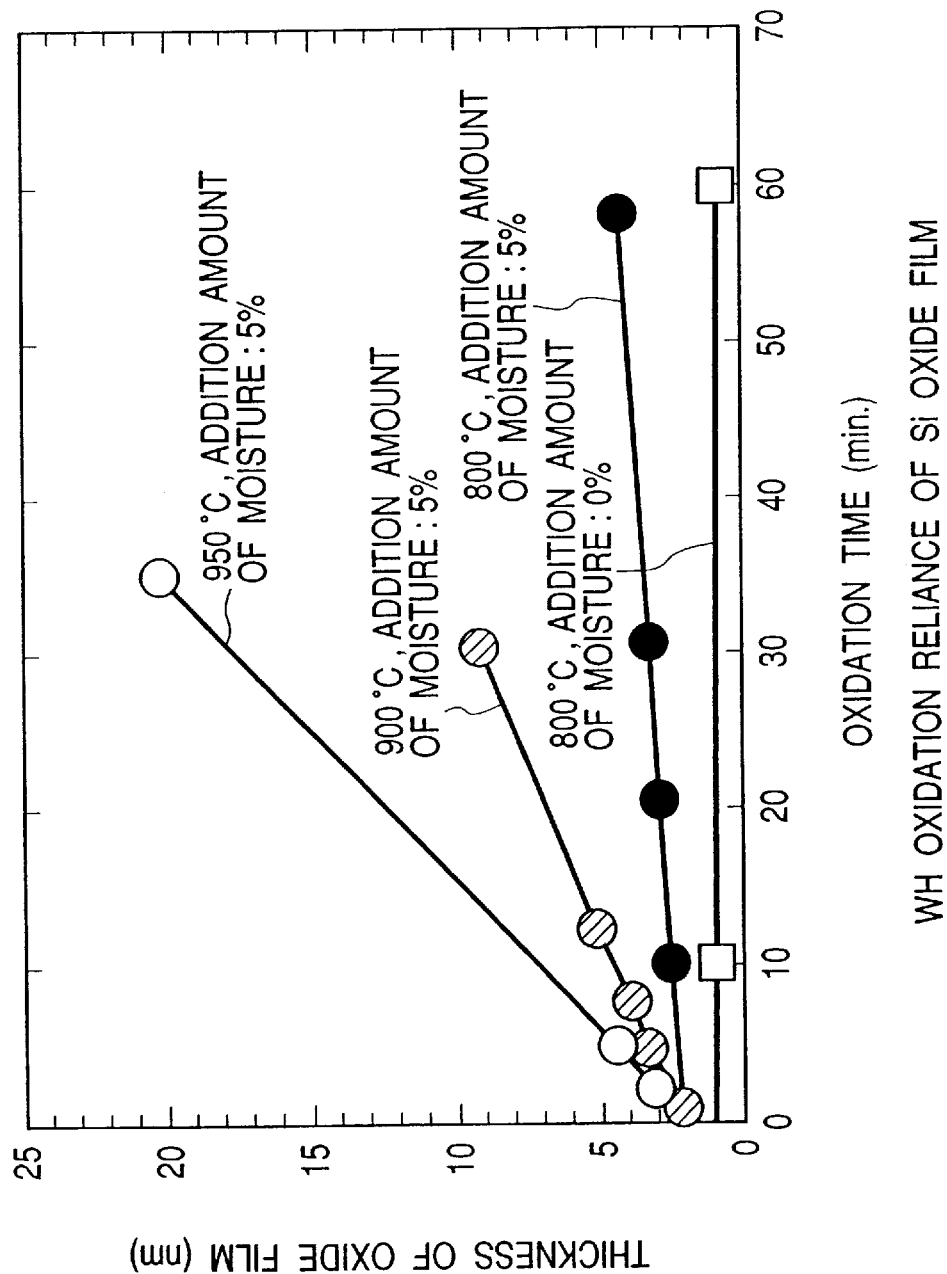
FIG. 14 is a graph showing the relationship between the oxidation processing time using the steam/hydrogen mixed gas and the film thickness of the silicon oxide.

FIG. 14 is a graph showing the relationship between the oxidation processing time using the steam/hydrogen mixed gas and the film thickness of the silicon oxide. As shown in the figure, the film thickness of the silicon oxide is increased substantially proportional to the oxidation time, but in the case where the moisture concentration is 0%, the film thickness is not increased even when the oxidation time is increased.

Figure 15:
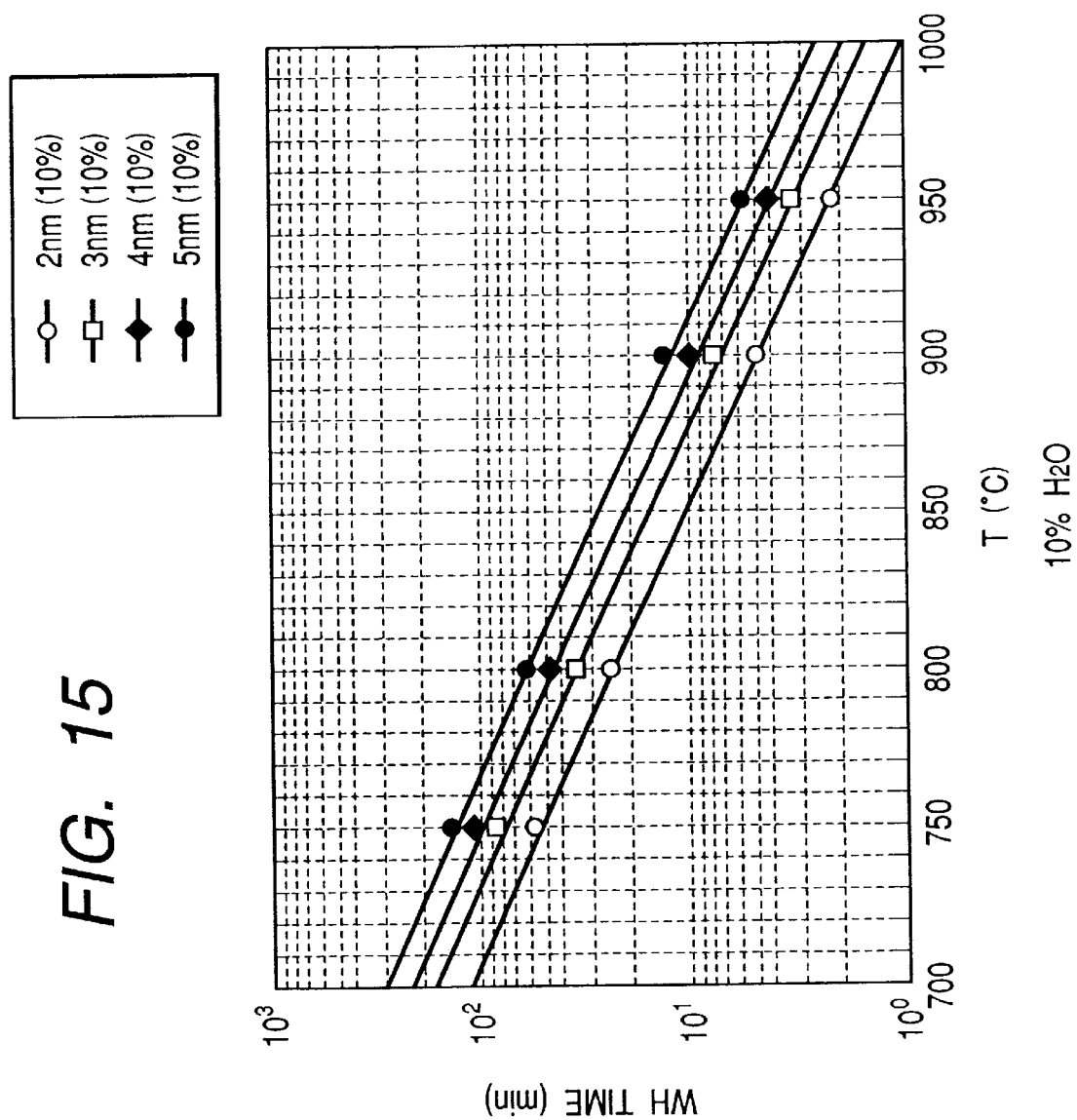
FIG. 15 is a graph showing the relationship between the oxidation temperature and the oxidation time.
Figure 16:
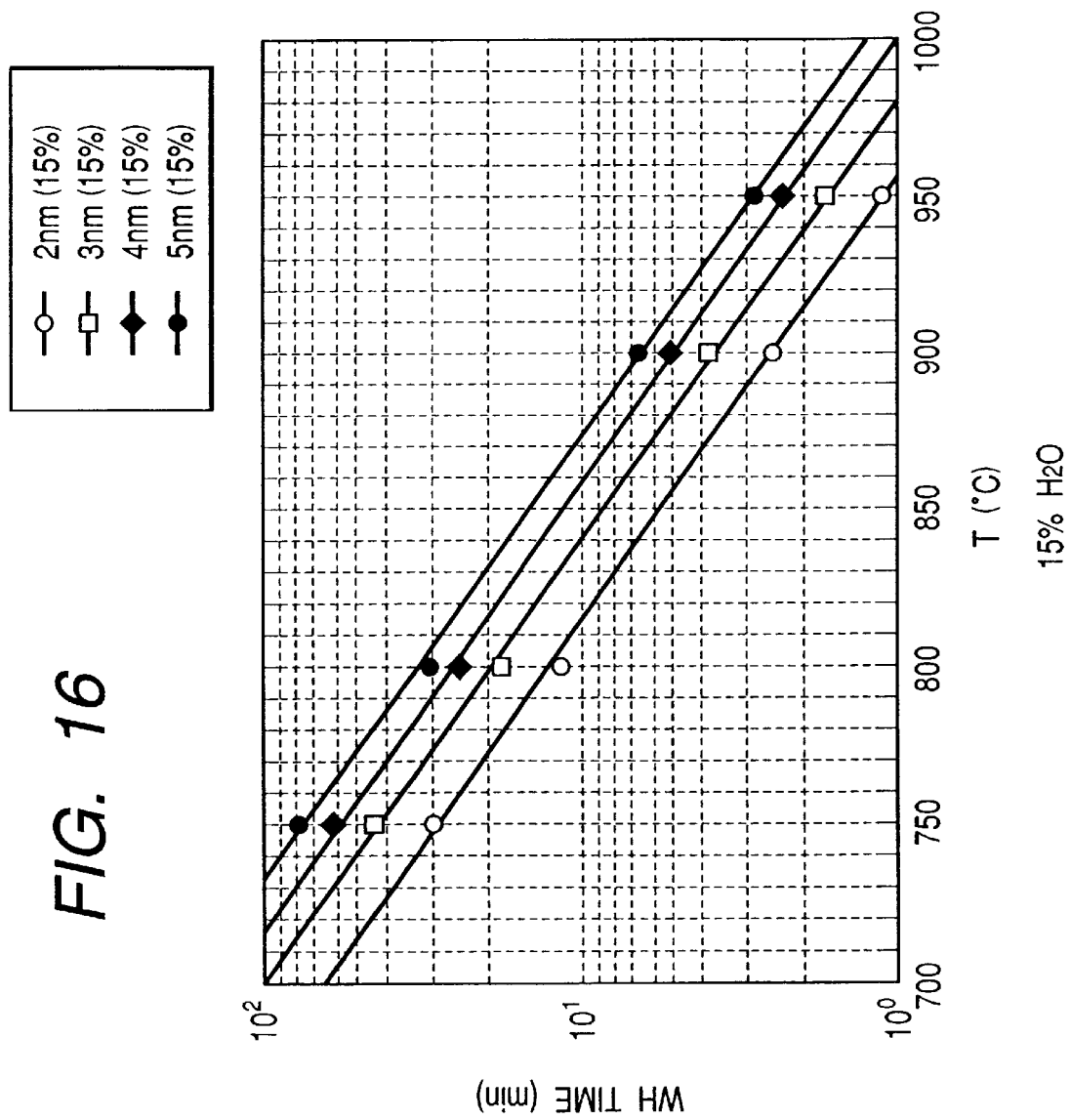
FIG. 16 is a graph showing the relationship between the oxidation temperature and the oxidation time.

FIGS. 15 and 16 are graphs showing the relationship between the oxidation temperature and the oxidation time for obtaining a certain oxide film thickness (2, 3, 4 and 5 mm) in the case where the moisture content of the steam/hydrogen mixed gas is 10% and 15%. As shown in the figures, the oxidation time required to obtain the certain oxide film thickness is shortened proportional to the oxidation temperature.

FIG. 17 is a graph showing the relationship between the temperature to which the gate electrode is subjected, which is formed by doping a polycrystalline silicon film having a film thickness of 100 nm formed on a silicon oxide film having a film thickness of 3.5 nm with B (boron) under the condition of an implantation energy of 5 keV and a dose amount of $4 \times 10^{15}$ per square centimeter, to the heat treatment and $V_{FB}$ (which is substantially equivalent to $V_{th}$). As shown in the figure, when the heat treatment temperature exceeds 850° C., is rapidly increased due to the amount of B (boron) diffusing into the substrate through the silicon oxide film being rapidly increased.

In order to perform a light oxidation process to compensate and regenerate the gate oxide film 9 in such a low thermal load condition that only Si (the semiconductor substrate 1 and the polycrystalline silicon films 10n and 10p) is selectively oxidized without oxidizing the W film 12 constituting a part of the gate electrodes 15n and 15p and the WN film 11 as a barrier layer, and B (boron) contained in the p-type polycrystalline silicon film 10p constituting a part of the gate electrode 15p is not diffused into the semiconductor substrate 1 (the n-type well 8) through the gate oxide film 9, the heating temperature of the semiconductor wafer 1A is set in a range of from 650° C., which is the lowest temperature at which the quality of the silicon oxide film is not deteriorated, to 900° C., at which the surface roughening of the semiconductor wafer 1A is liable to occur, preferably in a range of from 750 to 900° C., and more preferably at about 850° C., which is the highest temperature capable of suppressing diffusion of B (boron) into the substrate. The moisture concentration of the steam/hydrogen mixed gas at this time is set in a range of from 1% (about 1% in the partial pressure representation as shown in FIG. 13), which is the practical lowest concentration capable of growing the silicon oxide film, to the upper limit of the moisture concentration, at which the oxidation proceeds by a redox reaction. In particular, when the heating temperature of the semiconductor wafer 1A is set to about 850° C., the moisture concentration is preferably set to about 30% (43% in the above-mentioned partial pressure representation) or more to make the redox reaction rate large, and more preferably it is set to about 50% (100% in the partial pressure representation), which is the highest value of the moisture concentration, i.e., the thermodynamic maximum moisture concentration under that temperature condition (see, FIG. 13).

The moisture concentration in according with the invention is expressed by a percentage of the moisture partial pressure in the whole atmospheric pressure, or a percentage (i.e., partial pressure representation) where the hydrogen partial pressure is the denominator and the moisture partial pressure is the numerator as shown in FIG. 13. In the case where dilution is conducted by using an inert component, such as argon and helium, it does not contribute to the redox reaction at all or the contribution is so small that it can be ignored. In the examples of the invention, no other gas component other than hydrogen and moisture is added to the processing atmosphere unless otherwise indicated.

The suitable moisture concentration in the region of a not so high temperature is outside of the critical region to some extent as shown in FIG. 13, and in many cases is about from 5 to 30% (from 5.3% to 43% in the partial pressure representation), and more preferably from 8 to 25% (from 8.7% to 33% in the partial pressure representation), for various reasons, such as a guarantee of stable process conditions.

That is, when the heat treatment after the doping of boron is conducted at such a relatively high moisture concentration, the effect of preventing the leakage of boron, in which boron is diffused to the channel region through the gate insulating film contrary to desire, is large.

An example of a sequence of the light oxidation process using the single wafer processing oxidation furnace 100 will be described with reference to FIG. 18.

The chamber 101 of the single wafer processing oxidation furnace 100 is opened, and the semiconductor wafer 1A, which has been subjected to the process of the gate electrodes 15n and 15p, is loaded onto the susceptor 104 with the introduction of a purge gas (nitrogen) into the chamber. Thereafter, the chamber 101 is closed, and the purge gas is further continuously introduced to thoroughly carry out gas replacement inside the chamber 101. The susceptor 104 is heated using the heaters 102a and 102b (for example, to about 850° C.), so that the semiconductor wafer 1A is rapidly heated.

Hydrogen is then introduced into the chamber 101 to discharge the nitrogen. A nitrification reaction that is not intended may occur when nitrogen remains in the chamber 101, and thus in the case where the gate oxide film is not intended to be made as thick as possible, it is preferred to completely discharge the nitrogen. (In the atmosphere of the following light oxidation process, an inert gas such as argon, oxygen and nitrogen may be added, as well as hydrogen and moisture.)

Figure 19A:
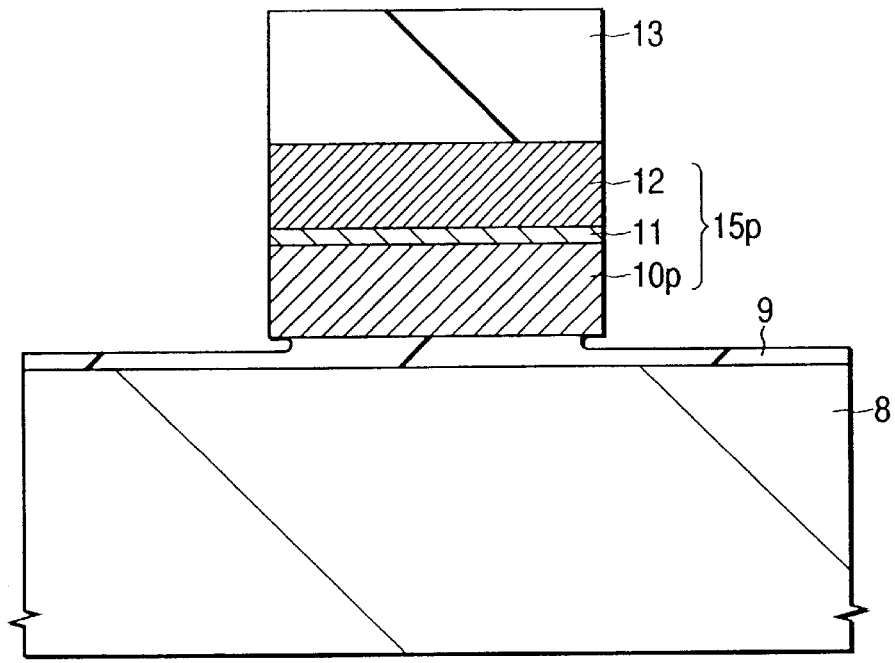
FIGS. 19(a) and 19(b) are partial enlarged cross sectional views showing the state of the gate oxide film after the light oxidation process.
Figure 19B:
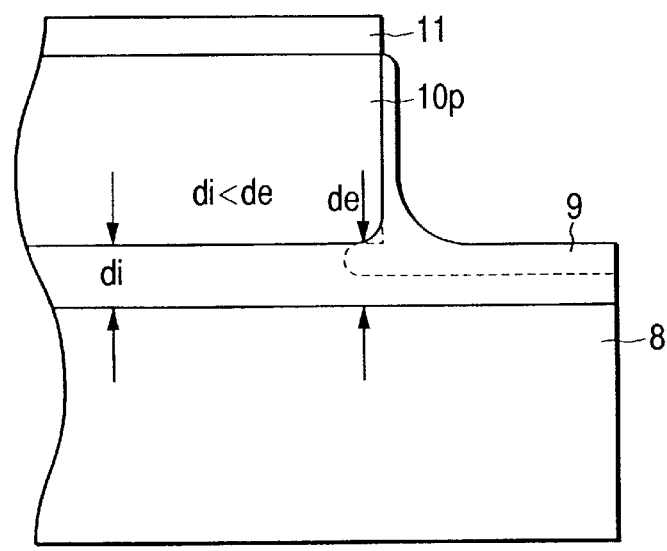

Subsequently, oxygen and excess hydrogen are introduced into the reactor 141 of the gas generating device 140, and a steam/hydrogen mixed gas containing water formed from oxygen and hydrogen with the catalytic function (having a moisture concentration of about 50%, for example) is introduced into the chamber 101 to oxidize the surface of the semiconductor wafer 1A for a prescribed period of time. Accordingly, the gate oxide film 9 that has been thinned by the wet etching is re-oxidized, and the profile at the edge part of-the side wall of the gate electrodes 15n and 15p that has been undercut, as shown in FIG. 19A, is improved. That is, as shown in FIG. 19B in an enlarged form, at the edge part of the side wall of the gate electrodes 15n and 15p, a sharp edge formed by etching is removed so that the edge is rounded to decrease the concentration of the electric field.

Similarly, as understood from FIGS. 19(a) and 19(g), at the edge part and the side part of the polysilicon electrode constituting the gate electrode, a part of the thermal oxidized film having a small radius of curvature disappears due to the additional thermal oxidation, or it is changed to one having a large radius of curvature. Accordingly, the undesirable concentration of the electric field at the edge part of the gate is reduced.

When the light oxidation is carried out for a long period of time, the oxide film thickness in the vicinity of the edge part of the gate electrode becomes unnecessarily thick, so that an offset is formed at the edge part of the gate electrode, and the threshold voltage ($V_{th}$) of the MOSFET deviates from the designed value. Furthermore, a problem arises in that a part of the B (boron) contained in the p-type polycrystalline silicon film 10p constituting a part of the gate electrode 15p is liable to be diffused into the substrate (the n-type well 8) and another problem arises in that the effective channel length becomes shorter than the processed value of the gate electrodes 15n and 15p.

In particular, in a fine MOSFET having a gate length of about 0.18 $\mu$m, the allowable amount of thinning of the gate processed dimension from the designed value is strictly limited from the standpoint of design of an element. This is because, when the amount of thinning is slightly increased, the threshold voltage is rapidly decreased due to the short channel effect. In the case of a gate electrode having a gate length of about 0.18 $\mu$m, since the thickness of the gate oxide film is about 3.5 nm, this is considered to be the limit of not causing a rapid decrease of the threshold voltage that the edge part of the side wall of the polycrystalline silicon film constituting the gate electrode is oxidized to about 1 nm by the light oxidation process. Therefore, the oxide film thickness that is grown by the light oxidation preferably has an upper limit of about a 50% increase from the gate oxide film thickness.

Thereafter, a purge gas (nitrogen) is introduced into the chamber 101 to discharge the steam/hydrogen mixed gas, followed by opening the chamber 101, and the semiconductor wafer 1A is unloaded from the susceptor 104 with introduction of the purge gas into the chamber, so as to complete the light oxidation process.

Figure 20:
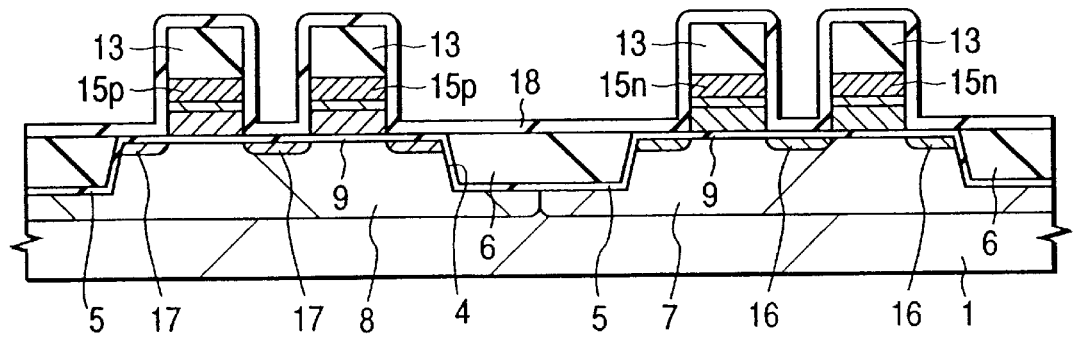
FIG. 20 is a partial cross sectional view of a semiconductor substrate showing a process for producing a CMOS LSI as an embodiment of the invention.

The CMOS process which is carried out after the light oxidation V/process will be briefly described below. As shown in FIG. 20, the p-type well 7 is subjected to ion implantation of an n-type impurity, such as P (phosphorous), to form an n$^-$-type semiconductor region 16 in the p-type well 7 on both sides of the gate electrode 15n, and the n-type well 8 is subjected to ion implantation of a p-type impurity, such as B (boron), to form a p$^-$-type semiconductor region 17 in the n-type well 8 on both sides of the gate electrode 15p, followed by accumulation of a silicon nitride film 18 having a film thickness of about 100 nm on the semiconductor substrate 1 by a CVD method.

Figure 21:
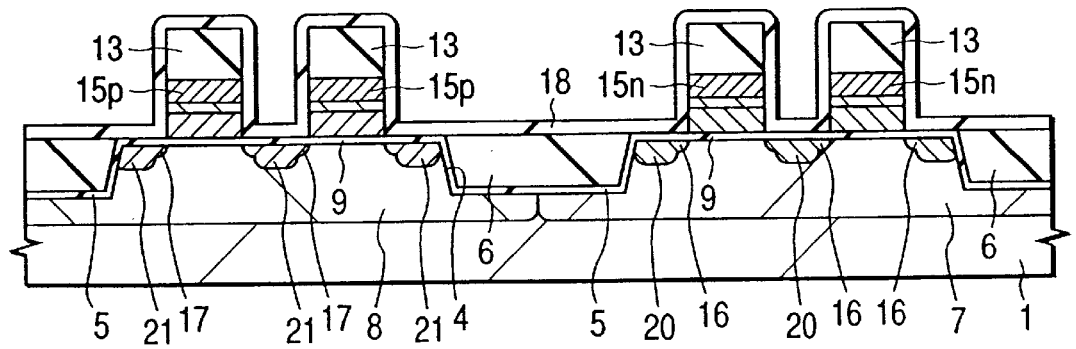
FIG. 21 is a partial cross sectional view of a semiconductor substrate showing a process for producing a CMOS LSI as an embodiment of the invention.

Then, as shown in FIG. 21, the p-type well 7 is subjected to ion implantation of an n-type impurity, such as As (arsenic), to form an n$^+$-type semiconductor region 20 (source and drain) of the n-channel MISFET, and the n-type well 8 is subjected to ion implantation of a p-type impurity, such as B (boron), to form an p$^+$-type semiconductor region 21 (source and drain) of the p-channel MISFET. An n-channel MISFET Qn and a p-channel MISFET Qp of a dual gate structure are completed at this step.

Figure 22:
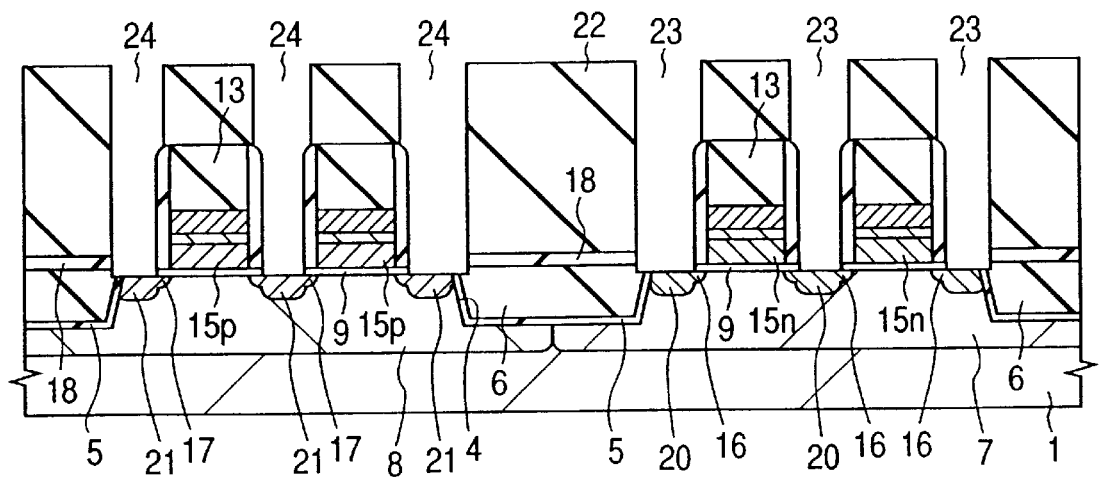
FIG. 22 is a partial cross sectional view of a semiconductor substrate showing a step in the process for producing a CMOS LSI representing an embodiment of the invention.

Then, as shown in FIG. 22, a silicon oxide film 22 is accumulated on the semiconductor substrate 1 by a CVD method, and after its surface is flattened by a chemical mechanical polishing method, the silicon oxide film 22 above the n$^+$-type semiconductor region 20 (source and drain) and the p$^+$-type semiconductor region 21 (source and drain) is removed by dry etching using a photoresist film as a mask. The etching is conducted in such a way that the etching rate of the silicon oxide film 22 is large with respect to the silicon nitride films 13 and 19, so that the silicon nitride film 18 above the n$^+$-type semiconductor region 20 (source and drain) and the p$^+$-type semiconductor region 21 (source and drain) is not removed.

Then, the silicon nitride film 18 and the gate oxide film 9 above the n$^+$-type semiconductor region 20 (source and drain) and p$^+$-type semiconductor region 21 (source and drain) are removed, so that a contact hole 23 is formed above the n$^+$-type semiconductor region 20 (source and drain), and a contact hole 24 is formed above the p$^+$-type semiconductor region 21 (source and drain). In order to minimize the amount of thinning of the semiconductor substrate 1, the etching is conducted in such a manner that the overetching amount is limited to the necessary minimum, and an etching gas that can provide a large selectivity with respect to the semiconductor substrate 1 (silicon) is used. The etching is also conducted in such a way that the silicon nitride film 19 is anisotropically etched, so that the silicon nitride film 18 remains on the side wall of the gate electrodes 15n and 15p. Accordingly, the contact hole 23 and contact hole 24 are formed with respect to the gate electrode 15n and the gate electrode 15p, respectively, in a self matching manner.

Figure 23:
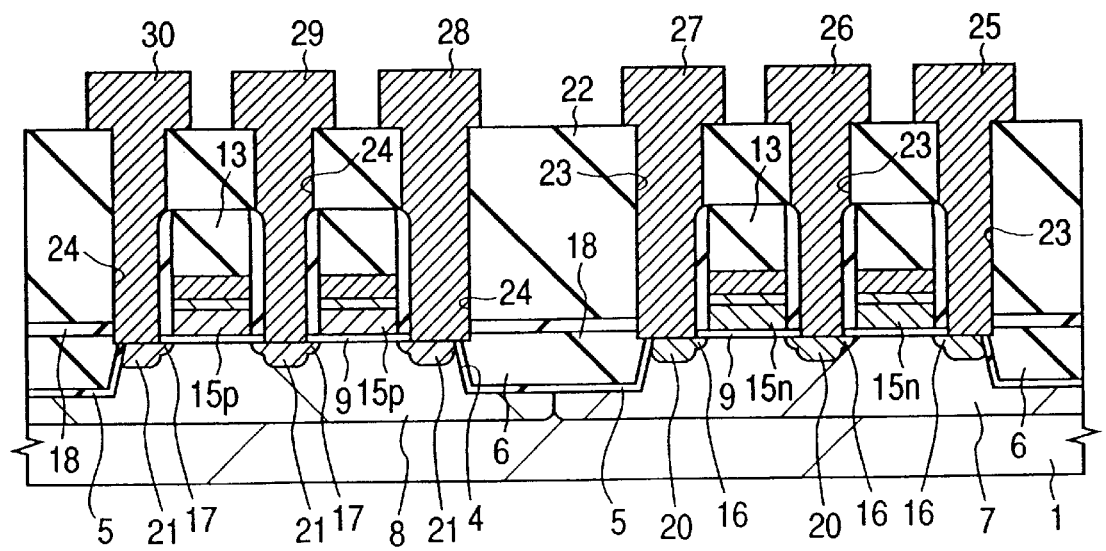
FIG. 23 is a partial cross sectional view of a semiconductor substrate showing a step in the process for producing the CMOS LSI.

Then, as shown in FIG. 23, interconnections 25 to 30 are formed by patterning a W film formed on the silicon oxide film 22, to complete a CMOS LSI according to this embodiment.

While the invention achieved by the inventors has been specifically described with reference to various embodiments thereof, the invention is not construed as being limited to the embodiments, but various changes can be made without deviating from the substance thereof.

Figure 24:
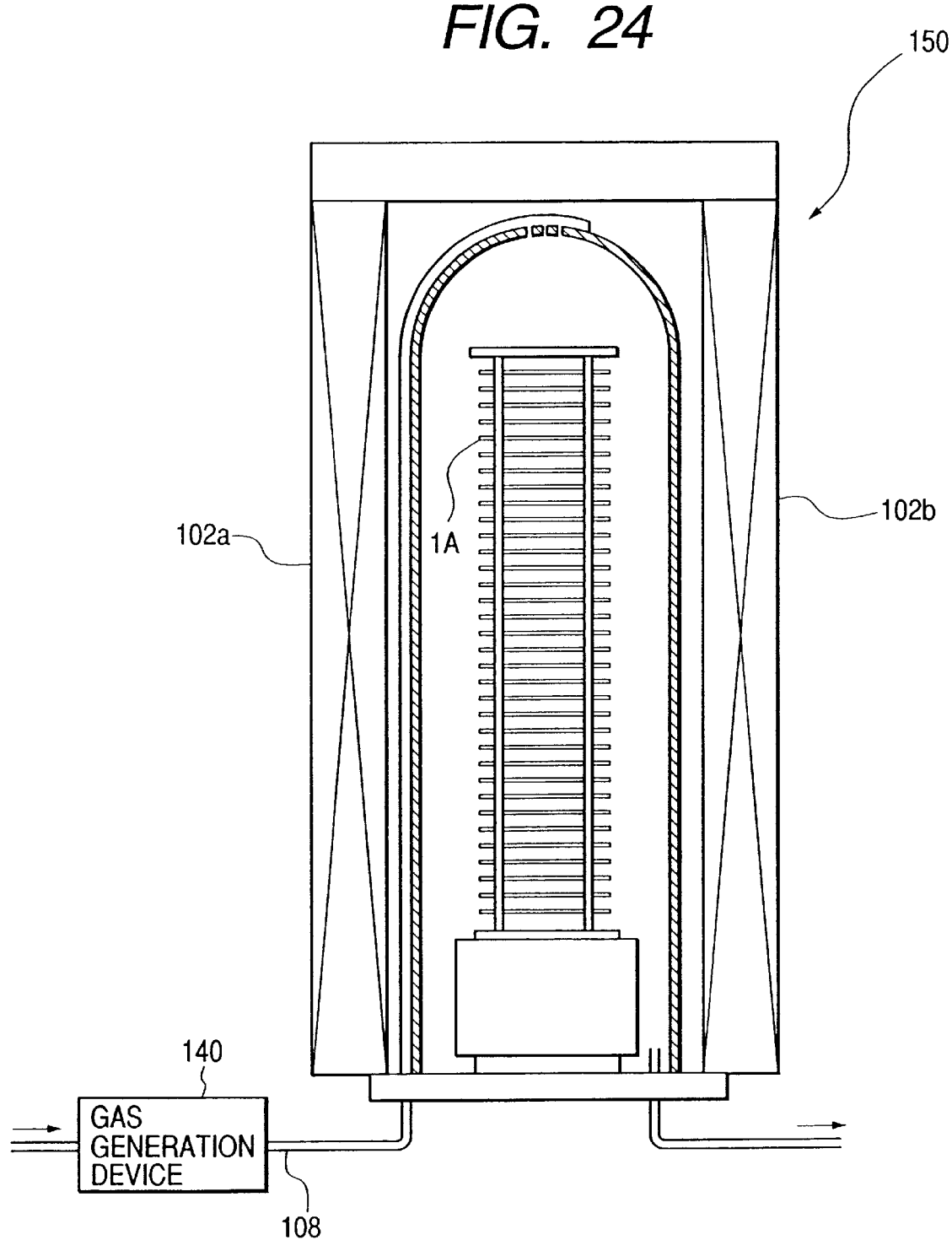
FIG. 24 is a schematic cross sectional view showing a batch processing vertical oxidation furnace used for the light oxidation process.
Figure 25:
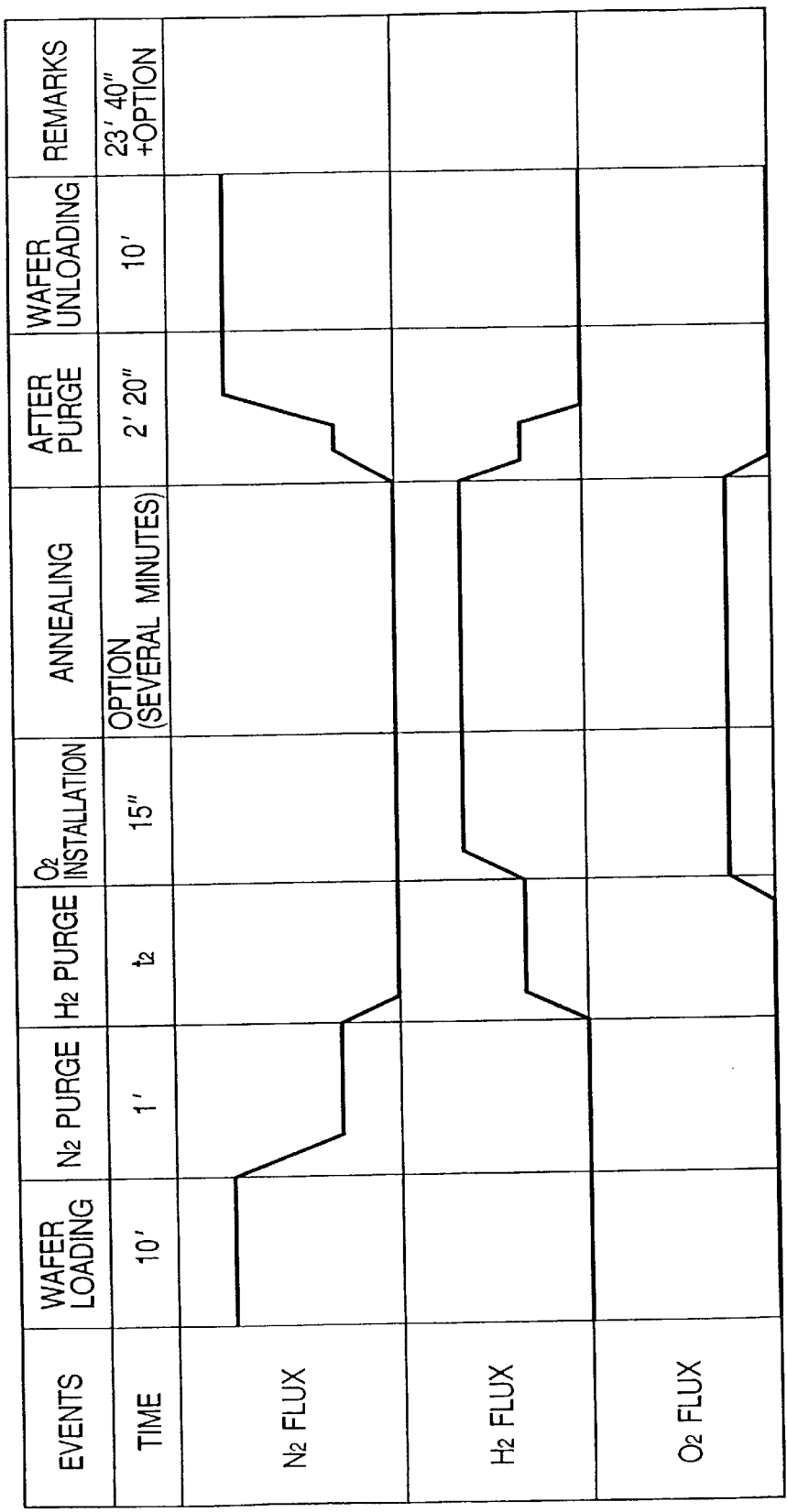
FIG. 25 is a diagram showing the sequence of the light oxidation process using a batch processing vertical oxidation furnace.

For example, as shown in FIG. 24, the light oxidation process of the gate oxide film can be conducted by using a batch processing vertical oxidation furnace 150 having a steam/hydrogen mixed gas generating device 140 of catalyst type, as described above, connected thereto. In the case where the batch processing vertical oxidation furnace 150 of this type is used, an oxidation furnace equipped with a temperature increasing/decreasing system is preferably used. An example of a sequence of the light oxidation process using the batch processing vertical oxidation furnace 150 is shown in FIG. 25.

While the embodiment is described for a case where a gate electrode having a polymetal structure is processed, the light oxidation process of the invention can be applied to a gate electrode having a polycide structure, in which a refractory metal film, such as a tungsten silicide, is laminated on a polycrystalline silicon film doped with boron.

The effect obtained from the representative embodiments of the invention will be briefly described below.

According to the invention, in a CMOS LSI employing a polymetal gate structure and a dual gate structure, both oxidation of a refractory metal film constituting a part of the gate electrode, and diffusion of boron contained in a p-type polycrystalline silicon film constituting a part of the gate electrode through a gate oxide film can be suppresses. Accordingly, the reliability and the production yield of a CMOS LSI constituted by a fine MOSFET having a short gate length can be improved. In particular, the effect described above is remarkable in the cases of a CMOS LSI constituted by a fine MOSFET having a gate length of 0.18 $\mu$m or less.

What is claimed is:

1. A process for producing a semiconductor integrated circuit device having a dual gate CMOS, comprising the steps of:
    (a) forming a silicon-containing electrode film over a gate insulating film containing a silicon oxide film formed over a silicon surface representing a major surface of a semiconductor wafer;
    (b) forming a refractory metal film over said silicon-containing electrode film via a barrier layer;
    (c) forming a gate electrode by patterning said silicon-containing electrode film, said barrier layer and said refractory metal film; and
    (d) after said step (c), subjecting said silicon-containing electrode film to a thermal oxidation treatment in a mixed gas atmosphere containing a hydrogen gas and steam and having a moisture concentration in a range of from 5% to a maximum concentration such that said refractory metal film is substantially not oxidized, wherein said steam is synthesized from hydrogen and oxygen in the presence of a catalyst, and said mixed gas atmosphere is produced by diluting said steam using hydrogen such that said moisture is provided in said range.

2. A process for producing a semiconductor integrated circuit device having a dual gate CMOS as claimed in claim 1, wherein the moisture concentration of said mixed gas atmosphere is from 8 to 25%.

* * * * *